(12) United States Patent  
Aouini et al.

(10) Patent No.: US 10,749,536 B1
(45) Date of Patent: Aug. 18, 2020

(54) HIGH-ORDER PHASE TRACKING LOOP WITH SEGMENTED PROPORTIONAL AND INTEGRAL CONTROLS

(71) Applicant: Ciena Corporation, Hanover, MD (US)

(72) Inventors: Sadok Aouini, Gatineau (CA); Naim Ben-Hamida, Ottawa (CA); Timothy James Creasy, Manotick (CA); Ahmad Abdo, Ottawa (CA); Mahdi Parvizi, Kanata (CA); Lukas Jakober, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/724,961

(22) Filed: Dec. 23, 2019

Related U.S. Application Data

(63) Continuation of application No. 16/287,063, filed on Feb. 27, 2019, now Pat. No. 10,516,403.

(51) Int. Cl.
*H03L 7/087* (2006.01)
*H03L 7/099* (2006.01)
*H03L 7/093* (2006.01)

(52) U.S. Cl.
CPC .............. *H03L 7/087* (2013.01); *H03L 7/093* (2013.01); *H03L 7/0994* (2013.01)

(58) Field of Classification Search
CPC ......... H03L 7/18; H03L 7/1976; H03L 7/093; H03L 7/08; H03L 7/081; H03L 7/1974; H03L 7/0814; H03L 7/0816; H03L 7/0818

See application file for complete search history.

(56) References Cited

U.S. PATENT DOCUMENTS 3,973,212 A   8/1976  Walloch
7,161,443 B2 * 1/2007  Chen ..................... H03L 1/027
                                                 331/158

(Continued)

FOREIGN PATENT DOCUMENTS

EP      3217559 A1   9/2017
GB    2 430 090 A    3/2007

OTHER PUBLICATIONS

Eiselt et al., Contribution of Timing Jitter and Amplitude Distortion to XPM System Penalty in WDM Systems, IEEE Photonics Technology Letters, vol. 11, No. 6, Jun. 1999, pp. 748-750.

(Continued)

*Primary Examiner* — Adam D Houston
(74) *Attorney, Agent, or Firm* — Clements Bernard Walker; Christopher L. Bernard; Lawrence A. Baratta, Jr.

(57) ABSTRACT

Clock circuits, components, systems and signal processing methods enabling digital communication are described. A phase locked loop device derives an output signal locked to a first reference clock signal in a feedback loop. A common phase detector is employed to obtain phase differences between a copy of the output signal and a second reference clock signal. The phase differences are employed in an integral phase control loop within the feedback loop to lock the phase locked loop device to the center frequency of the second reference signal. The phase differences are also employed in a proportional phase control loop within the feedback loop to reduce the effect of imperfect component operation. Cascading the integral and proportional phase control within the feedback loop enables an amount of phase error to be filtered out from the output signal.

19 Claims, 15 Drawing Sheets

(56) References Cited

U.S. PATENT DOCUMENTS

| | | | |
|---|---|---|---|
| 7,277,518 B2 | 10/2007 | Loke et al. | |
| 7,486,145 B2* | 2/2009 | Floyd | H03L 7/1974 |
| | | | 327/115 |
| 7,492,195 B1 | 2/2009 | Patil et al. | |
| 7,567,132 B2 | 7/2009 | Thompson | |
| 7,742,507 B1 | 6/2010 | Kurowski et al. | |
| 7,821,343 B1 | 10/2010 | Wong et al. | |
| 8,085,101 B2* | 12/2011 | Yamamoto | H03L 7/087 |
| | | | 327/156 |
| 8,233,578 B2* | 7/2012 | Chen | H03L 7/081 |
| | | | 327/147 |
| 8,362,815 B2 | 1/2013 | Pavlovic et al. | |
| 8,384,452 B1 | 2/2013 | Parker et al. | |
| 8,433,025 B2 | 4/2013 | Sun et al. | |
| 8,436,665 B2 | 5/2013 | Nakamuta et al. | |
| 8,513,992 B1 | 8/2013 | Majumder et al. | |
| 8,665,928 B1 | 3/2014 | Klein et al. | |
| 9,225,430 B2 | 12/2015 | Harley et al. | |
| 9,608,644 B1 | 3/2017 | Raj et al. | |
| 9,705,514 B2 | 7/2017 | Perrott et al. | |
| 10,063,367 B1 | 8/2018 | Aouini et al. | |
| 10,110,240 B1* | 10/2018 | Satoh | H03L 7/193 |
| 2002/0180498 A1 | 12/2002 | O'Leary et al. | |
| 2004/0012423 A1* | 1/2004 | Maeda | H03L 7/23 |
| | | | 327/156 |
| 2004/0151271 A1* | 8/2004 | Krueger | G06F 1/04 |
| | | | 375/376 |
| 2004/0207437 A1 | 10/2004 | Shibahara | |
| 2004/0222831 A1* | 11/2004 | Mitsumoto | H03L 7/191 |
| | | | 327/157 |
| 2005/0077935 A1* | 4/2005 | Giuroiu | H03L 7/1976 |
| | | | 327/156 |
| 2005/0134338 A1* | 6/2005 | Momtaz | H03D 13/003 |
| | | | 327/158 |
| 2006/0001464 A1 | 1/2006 | Yokozeki et al. | |
| 2006/0024062 A1 | 2/2006 | Jakober et al. | |
| 2006/0056561 A1 | 3/2006 | Zhang | |
| 2007/0146025 A1* | 6/2007 | Huang | H03K 5/1565 |
| | | | 327/156 |
| 2008/0094145 A1 | 4/2008 | Kuan et al. | |
| 2008/0180142 A1* | 7/2008 | Chou | H03L 7/081 |
| | | | 327/148 |
| 2009/0121749 A1 | 5/2009 | Roberts et al. | |
| 2009/0273378 A1* | 11/2009 | Mangnall | G06F 9/4401 |
| | | | 327/156 |
| 2010/0123491 A1* | 5/2010 | Palmer | H03L 7/07 |
| | | | 327/156 |
| 2010/0123498 A1 | 5/2010 | Bae et al. | |
| 2010/0264962 A1* | 10/2010 | Kitayama | H03L 1/026 |
| | | | 327/156 |
| 2010/0321074 A1* | 12/2010 | Song | H03L 7/1072 |
| | | | 327/157 |
| 2011/0009083 A1* | 1/2011 | Namba | H03L 7/1976 |
| | | | 455/318 |
| 2011/0032013 A1* | 2/2011 | Nelson | H03L 7/23 |
| | | | 327/156 |
| 2011/0122973 A1* | 5/2011 | Tsukio | H03L 7/197 |
| | | | 375/316 |
| 2011/0227618 A1* | 9/2011 | Miyano | G06F 1/04 |
| | | | 327/158 |
| 2011/0234274 A1 | 9/2011 | Matsumoto et al. | |
| 2011/0248752 A1* | 10/2011 | Willey | H03L 7/0816 |
| | | | 327/117 |
| 2011/0254599 A1 | 10/2011 | Dikshit et al. | |
| 2011/0304366 A1 | 12/2011 | Kanda et al. | |
| 2011/0316595 A1 | 12/2011 | Bolton | |
| 2012/0119801 A1 | 5/2012 | Hsieh et al. | |
| 2012/0133403 A1 | 5/2012 | Miyanaga et al. | |
| 2012/0163519 A1* | 6/2012 | Choudhury | H04L 7/033 |
| | | | 375/354 |
| 2012/0288044 A1 | 11/2012 | Roberts et al. | |
| 2013/0033293 A1 | 2/2013 | Zhang | |
| 2013/0147529 A1* | 6/2013 | Ganesan | H03L 7/1803 |
| | | | 327/156 |
| 2013/0300470 A1* | 11/2013 | Mohajeri | H03L 7/0814 |
| | | | 327/157 |
| 2014/0266351 A1* | 9/2014 | Na | H03L 7/0812 |
| | | | 327/158 |
| 2015/0004919 A1 | 1/2015 | Ek | |
| 2015/0162917 A1* | 6/2015 | Tsukuda | H03L 7/197 |
| | | | 327/115 |
| 2015/0222273 A1 | 8/2015 | Allan et al. | |
| 2015/0222284 A1* | 8/2015 | Evans | H03L 7/18 |
| | | | 327/107 |
| 2015/0222469 A1* | 8/2015 | Onishi | H04L 7/0331 |
| | | | 375/376 |
| 2015/0263742 A1* | 9/2015 | McLaurin | H03L 7/23 |
| | | | 327/158 |
| 2015/0311908 A1* | 10/2015 | Laaja | H03L 7/093 |
| | | | 327/159 |
| 2015/0341041 A1 | 11/2015 | Balachandran et al. | |
| 2015/0372683 A1* | 12/2015 | Takahashi | H03L 7/0814 |
| | | | 365/233.1 |
| 2016/0142060 A1* | 5/2016 | Im | H03L 7/08 |
| | | | 327/158 |
| 2016/0156342 A1* | 6/2016 | Yun | H03K 7/08 |
| | | | 327/158 |
| 2016/0380752 A1* | 12/2016 | Ahmad | H03L 7/085 |
| | | | 327/158 |
| 2017/0257106 A1 | 9/2017 | Park et al. | |
| 2018/0278337 A1 | 9/2018 | Jensen et al. | |

OTHER PUBLICATIONS

Gardner, A BPSK/QPSK Timing-Error Detector for Sampled Receivers, IEEE Transactions on Communications, vol. COM-34, No. 5, May 1986, pp. 423-429.

Grigoryan et al., Calculation of Timing and Amplitude Jitter in Dispersion-Managed Optical Fiber Communications Using Linearization, Journal of Lightwave Technology, vol. 17, No. 8, Aug. 1999, pp. 1347-1356.

International Telecommunication Union, Terms and definitions for optical transport networks, ITU-T G.870/Y.1352, Telecommunication Standardization Sector of ITU, Nov. 2016, pp. 1-16.

Jun. 23, 2020, International Search Report and Written Opinion issued for International Application No. PCT/US2020/019577.

* cited by examiner

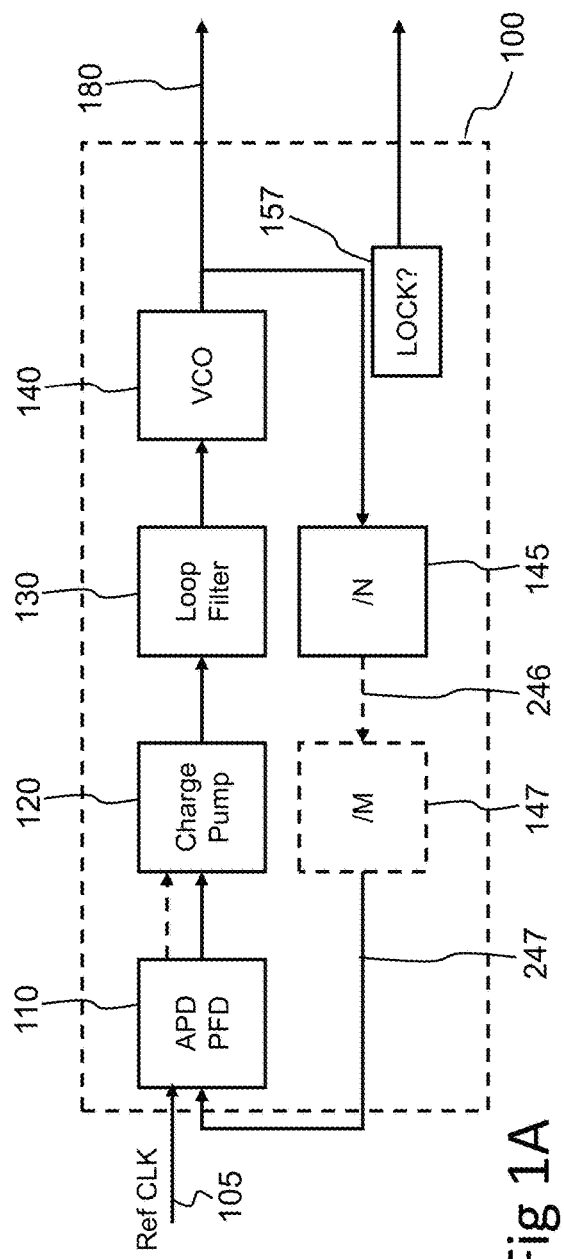
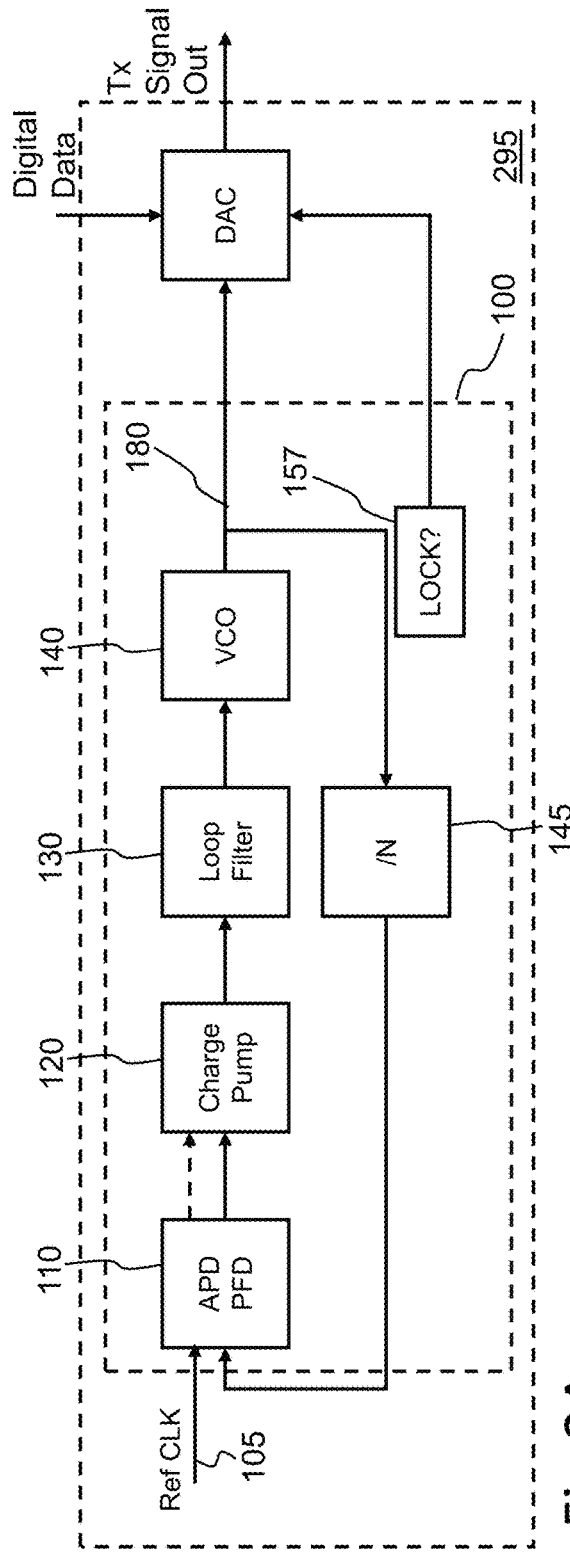

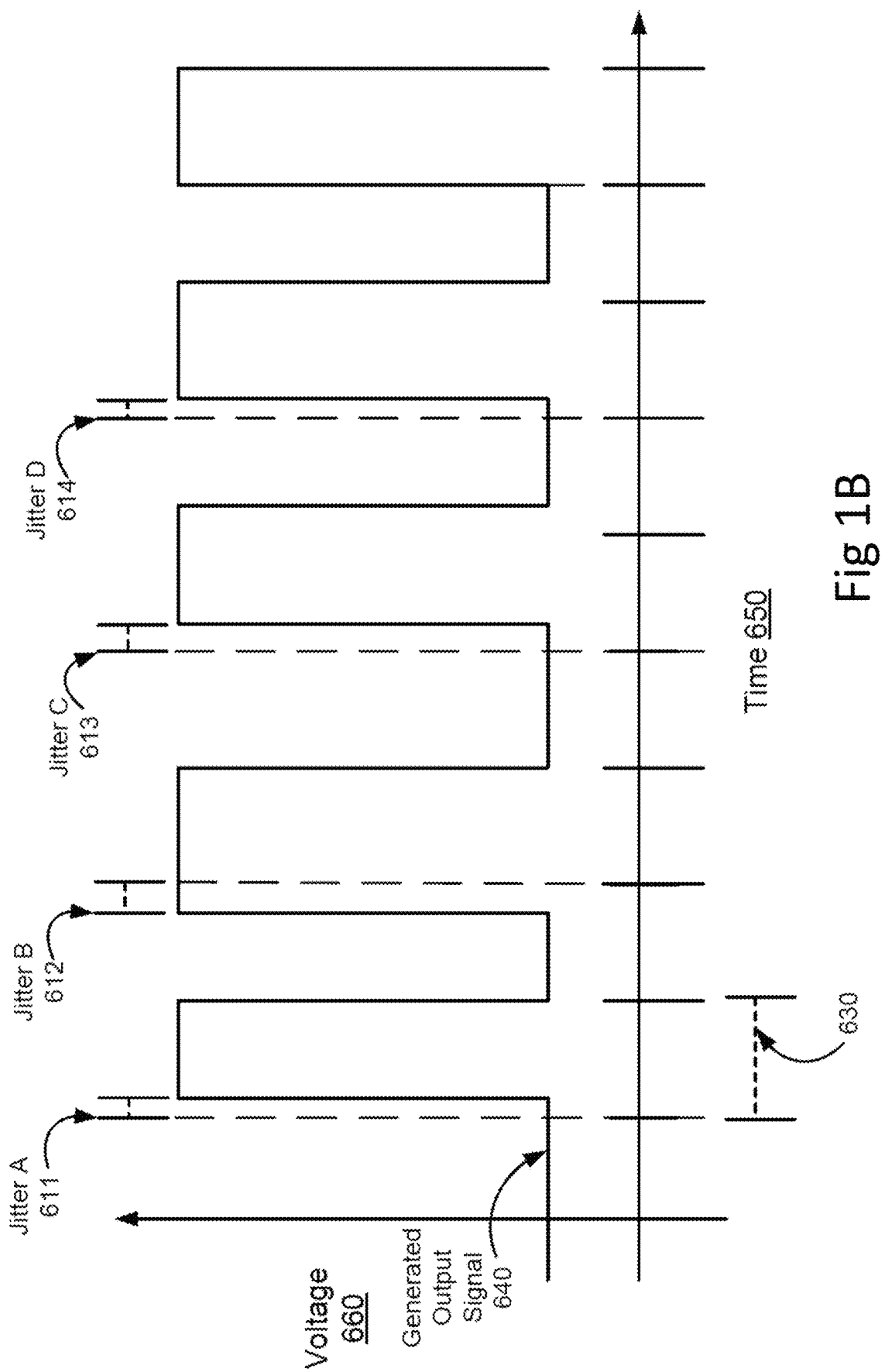

HIGH-ORDER PHASE TRACKING LOOP WITH SEGMENTED PROPORTIONAL AND INTEGRAL CONTROLS

CROSS-REFERENCE

The present disclosure is a continuation of U.S. patent application Ser. No. 16/287,063, filed Feb. 27, 2019, which is now U.S. Pat. No. 10,516,403, issued Dec. 24, 2019.

BACKGROUND

A phase locked loop (PLL) is employed to produce a synchronized clock signal that has a phase matched with that of a reference clock signal, typically the synchronized clock signal has a higher frequency than the frequency of the reference clock signal. The reference clock signal can be provided by an onboard reference clock coupled to a PLL device. Alternatively to using an onboard reference clock, the synchronized clock signal can be matched to the phase of source clock information obtained through synchronous Ethernet (SyncE), or from a precision time protocol (PTP), such as a protocol based on the IEEE 1588 standard, the specifications of which are incorporated herein by reference.

Typically, the synchronized clock signal can be used to drive various operations performed by apparatus providing receive/transmit or input/output data transfers, for example in a transceiver or in a serializer-deserializer (SerDes) input/output component in a digital system. Examples of the transceiver include an optical transceiver, a wireless transceiver, etc.

For example, in a transmit direction, such a synchronized clock signal provided by a PLL device can be used to drive a Digital to Analog Converter (DAC) to send digital data over a link. The PLL device is said to be used for clock generation and the synchronized clock signal is said to provide a transmitter clock signal.

Conversely, in the receive direction, such a synchronized clock signal provided by a PLL device can be used to drive an Analog to Digital Converter (ADC) to sample an input signal received over a link (electrical connection, optical cable, wireless Radio Frequency beam, etc.) In the receive direction, the synchronized clock signal needs to be phase matched and frequency matched to a transmitter clock signal as received at a local receiver as part of the input signal received. The PLL device in such a receiver is said to be used for clock extraction and the synchronized clock signal is said to provide a receiver clock signal.

Clock generation can also be used to drive clock trees for example.

SUMMARY

In general, an analog phase locked loop (PLL) device includes a voltage-controlled oscillator (VCO) component that generates a VCO output signal which is signal processed to provide the synchronized clock signal based on the reference clock signal.

FIG. 1A illustrates a generic PLL device 100. A reference clock signal 105 can include a voltage signal from an onboard or external reference clock source (not shown) to which the phase of the synchronized clock signal 180 of the PLL device 100 is intended to lock to. The reference clock source can be software and/or hardware, such as an integrated circuit, that includes functionality for generating and/or providing timing information to the PLL device 100. For example, a hardware reference clock source can include a crystal oscillator or a global position system (GPS) receiver. Software examples of reference clock sources include an implementation of a network protocol over a communications network for synchronizing clocks, such as synchronous Ethernet (SyncE), or an implementation of a precision time protocol (PTP) for example compliant to the IEEE 1588 standard.

The analog PLL device 100 operates in a signal processing loop which progressively, over a number of loop cycles, adjusts the VCO output signal to provide the synchronized clock signal. The signal processing loop of the PLL device 100 includes an analog phase detector 110 employed to extract a difference between a feedback copy 247 of a VCO output signal 180 and the reference clock signal 105. While an analog phase detector 110 is shown inside the PLL device 100 in FIG. 1, in other implementations an analog phase-frequency detector can be used instead. A phase-frequency detector inside the PLL device 100 can produce two signals that correspond to the phase difference and a frequency difference rather than a single phase difference signal. In other implementations, a digital phase detector can be used instead of the analog phase detector 110 with due changes in the operation of the PLL device 100 and feedback loop.

A feedback divider includes hardware, such as an integrated circuit, having functionality to divide the frequency of an input signal by an N-multiple. In the feedback loop of PLL device 100, the input signal of the feedback divider 145 is output signal 180 and such division by the feedback divider 145 produces a corresponding feedback signal 247 which is a copy of the output signal 180 at a lower frequency. For example, the PLL device 100, and particularly the VCO 140, multiplies the reference signal 105 by an N-multiplier to generate the output signal 180. In the feedback loop of the PLL device 100, feedback divider 145 accounts for the increased frequency of the output signal 180 in order to return feedback signal 247 as an input to the analog phase detector 110 at a similar frequency as that of reference signal 105. Optionally, a cascaded feedback divider 147 is illustrated to further divide the frequency in feedback loop by another M-multiple.

The PLL device 100 also includes a charge pump 120, a loop filter 130 and various other PLL components (some shown in more detail below). A feedback signal path between the output of the VCO 140 and the analog phase detector 110 can include one or more feedback dividers 145, 147.

For example, the charge pump 120 includes hardware that provides functionality to generate a current signal from a voltage signal, e.g., a current signal that relates to the phase difference (and the frequency difference) detected by the analog phase detector 110.

The loop filter 130 includes hardware having functionality to check stability within the PLL device 100 as well to operate as a frequency bandwidth limiter to synchronize the output signal 180 with the reference signal 105. For example, loop filter 130 includes a low pass filter that operates according to a current signal produced by the charge pump 120 to output a signal. In this sense, the analog PLL device 100 synchronizes to the reference clock signal with a high bandwidth to reduce (VCO) phase noise.

The voltage-controlled oscillator device 140 includes hardware having functionality to generate an oscillating signal (180) typically at a higher frequency than that of the reference clock signal 105. For example, the voltage-controlled oscillator device 140 can include functionality to obtain the signal from the loop filter 130 to generate the output signal 180 with a predefined period and frequency.

A person of skill in the art would understand that signal processing functionality of PLL device 100 operating in a loop can have startup characteristics and steady state characteristics. The PLL device 100 can provide a lock signal output by steady-state detector 157 indicative of startup (unsettled, unlocked) and steady-state (settled, locked) operation. The steady-state detector 157 can be hardware and/or software that includes functionality to determine whether the output signal 180 is in a steady-state mode. In the steady-state mode, the phase (and frequency) of the output signal 180 may be locked to the reference signal 105. For example, an amount of phase error and/or frequency error may have converged to a (local) minimum where the output signal 180 is approximately phase matched and frequency fixed with respect to the reference signal 105. Conversely, when the PLL device 100 is in a transient mode, the PLL device 100 may be adjusting the phase and/or frequency of the output signal 180 to match the reference signal 105. Typically, in transient mode the oscillator of the VCO 140 may have just been turned on and may not have settled yet.

In some applications, the PLL device 100 is used for clock generation. In other applications, output signal 180 can be an extracted clock signal obtained using the reference signal 105. Regardless of clock generation/extraction application, the VCO 140 is not a perfect oscillator and other elements in the PLL loop of the PLL device 100 are not perfect in their operation either. As described herein above, the feedback path is used to provide information from the output 180 of the PLL device 100, typically a copy 247 of the output signal 180, back to the input of the PLL device 100 for comparison with the reference clock signal 105 repeatedly in a loop.

In clock generation applications it is desired for the output signal 180 to be ideal in the sense of having a fixed frequency locked to the phase of the reference clock signal 105. In practice however, the output signal 180 has departures from an ideal waveform, departures which are referred throughout herein as jitter. Feedback control is employed to reduce/suppress and preferably reject/cancel jitter in the PLL loop. In clock extraction applications it is desired for the output signal 180 to track the remote transmitter clock. Feedback control is employed in order to follow the remote transmitter clock to reduce/suppress and preferably reject/cancel dynamic jitter between the remote transmitter clock (as received) and the output signal 180.

FIG. 1B schematically illustrates an example of a timing diagram of the output signal 180 obtained during phase locked operation of the PLL device 100. As shown in FIG. 1B, a generated output signal 640 (output signal 180) is compared with a desired ideal (output) signal 630 along a time axis and another axis for example with respect to voltage. It is important to note that the desired ideal signal 630 is not a physical signal in an I/O or transceiver apparatus, and the reference clock signal 105 typically has lower frequency than the ideal signal 630. Thus, while the ideal signal period 630 is constant, for various periods the generated output signal 640 may deviate from the ideal signal period 630. Such deviations may be the result of PLL noise introduced by one or more components in a PLL device, for example the generated output signal 640 includes various amounts of PLL noise i.e., jitter 611, jitter 612, jitter 613, jitter 614 identifying departures of the generated output signal 640 from the ideal signal period 630. While time-interval error jitter is shown by jitter 611, jitter 612, jitter 613, and/or jitter 614, other types of jitter may also exist in the generated output signal 640, such as cycle-to-cycle period jitter, long term jitter, phase jitter, and any other forms of phase noise.

FIG. 2A illustrates a block diagram of a transmitter apparatus. As shown in FIG. 2A, a clock circuit 295 includes PLL device 100 providing clock generation. Clock circuit 295 can be a portion of an I/O or a transceiver apparatus that includes hardware and/or software for transmitting a clock signal within the same or to another computing device. Output signal 180 of the PLL device 100 is employed to provide cadence to a digital-to-analog converter (DAC) which includes hardware and/or software to output digital data as an output signal TxSignalOut for transmission over a link. Alternatively to use in a transmitter, output signal 180 of clock circuit 295 can be used to drive (not shown) a clock tree (without the use of a DAC). Assuming that the reference clock 105 is ideal, the PLL jitter (FIG. 1B) of clock circuit 295 can be regarded as clock generation jitter.

With reference to FIG. 2B, a VCO 140 is used in a PLL loop for data signal extraction at a local receiver. For successful data signal extraction, the data clock of the local receiver at the near end of the link needs to follow the data clock of the remote transmitter at the far end of the link. The input signal received from the remote transmitter includes both data sent and a transmitter clock signal of the remote transmitter; the PLL device 100 is employed to extract the transmitter clock signal from the input signal.

In the receiver apparatus schematically illustrated in FIG. 2B, the output signal 180 of the VCO device 140 is employed to provide cadence to an analog-to-digital converter ADC which includes hardware and/or software to convert the received input signal to a digital data output signal providing data extraction from the received input signal. It is desired for the output signal 180 of the PLL device 100 to have a frequency matched to the frequency of the received input signal and phase locked to the phase of the received input signal. In practice however the output signal 180 has departures from the received input signal, departures which are referred herein as clock recovery jitter.

The data clock of the remote transmitter can be, and typically is, noisy including transmitter jitter for example as described hereinabove. It is emphasized that any transmitter data clock signal, ideal (theoretical) or noisy (practical), can only be seen at the local receiver through the physical link between the remote transmitter and the local receiver, physical link which itself is noisy. A simplification herein is that the local receiver cannot distinguish between remote transmitter jitter and link jitter.

A common way of implementing clock recovery in a receiver is by directly controlling the VCO 140 through a proportional/integral controller in a manner summarily illustrated in FIG. 2B. Notably, in the prior art the VCO 140 is controlled directly. A digital phase detector 210 (typically Godard type) extracts the transmitter clock from the received input signal and the output of the digital phase detector 210 is used by a proportional/integral controller 222 to adjust the receiver VCO 140 directly.

A person of ordinary skill in the art would understand that there is a loop delay associated with the transmitter clock phase extraction. As the signal path in the PLL loop includes a high pass filter in the forward signal path (from VCO to output) and low pass filter in the feedback signal path (from data clock 185 to output), a 3 dB cutoff point needs to be increased for successful operation which leads to excessive peaking. FIG. 2C illustrates peaking in the clock recovery provided by prior art attempts such as illustrated in FIG. 2B. Excessive signal processing delay in the loop limits clock recovery bandwidth. The achievable bandwidth of such a clock recovery loop needs to be limited to a low value to avoid excessive peaking. Limiting clock recovery bandwidth directly affects the overall jitter rejection in the PLL loop since a small bandwidth limits the amount of VCO phase noise suppression which follows a high-pass transfer function.

Accordingly, depending on application, known prior art solutions limitations include: lower performance, larger die area, higher power consumption, worst jitter performance in terms of clock recovery (signal tracking). There is a need in applications employing clock circuits reduce/suppress and ultimately reject jitter.

One aspect of the solution proposed herein includes emulating a VCO as part of a digital control loop. Another aspect of the proposed solution proposed herein includes splitting feedback loop control in two. In accordance with the proposed solution, a method for operating a clock circuit is presented which emulates digitally the operation of a VCO with a digital accumulator followed by segmented controls providing proportional and integral loop control functions. A combination of a phase rotator and an accumulator is employed to perform frequency tracking (integral path) and a fine digitally controlled delay element is employed to perform the phase tracking (proportional path).

In general, in accordance with an aspect of the proposed solution embodiments employ apparatus including a phased locked loop (PLL) device having a first reference clock signal and a signal processing system coupled to the PLL device. The signal processing system obtains an output signal from the PLL device. The signal processing system further determines, using a digital phase detector operating on a copy of the output signal and second reference clock signal clock signal to determine an amount of phase difference between the output signal and second reference clock signal. The processing system employs the digital phase detector and a digital accumulator to combine multiple phased differences in an integration window (integral path) to filter, using a phase rotator, a portion of the amount of phase difference from the output signal to generate a filtered signal. In accordance with another aspect, the embodiments employ a digitally controlled fine delay element to provide additional signal filtering (proportional path) in the feedback loop of the PLL device. The output of the same digital phase detector is also employed to control the delay element. Clock circuit implementations in which the second reference clock signal is a copy of the first reference clock signal can provide clock generation in a transmitter. Clock circuit implementations in which the second reference clock signal is a transmitter clock signal received from a remote transmitter provide clock extraction in a receiver.

In the following detailed description of various embodiments numerous specific details are set forth in order to provide a more thorough understanding of the proposed solution. However, it will be apparent to one of ordinary skill in the art that the invention may be practiced without these specific details. Well-known features have not been described in detail to avoid unnecessarily complicating the description.

Specific embodiments of the invention will now be described in detail with reference to the accompanying figures. Like elements in the various figures are denoted by like reference numerals.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Other aspects of the invention will be apparent from the following description and the appended claims.

BRIEF DESCRIPTION OF DRAWINGS

FIG. 1A is a schematic circuit diagram illustrating a generic PLL loop;

FIG. 1B shows an example of a timing diagram illustrating PLL jitter in a PLL loop;

FIG. 2A is a schematic circuit diagram illustrating a simplified transmitter of prior art

DETAILED DESCRIPTION

Embodiments of the proposed solution provide systems, apparatus, clock circuits and signal processing methods indirectly controlling VCO of a PLL device via a feedback path in a PLL loop.

Phase Rotator

Figure 3A:
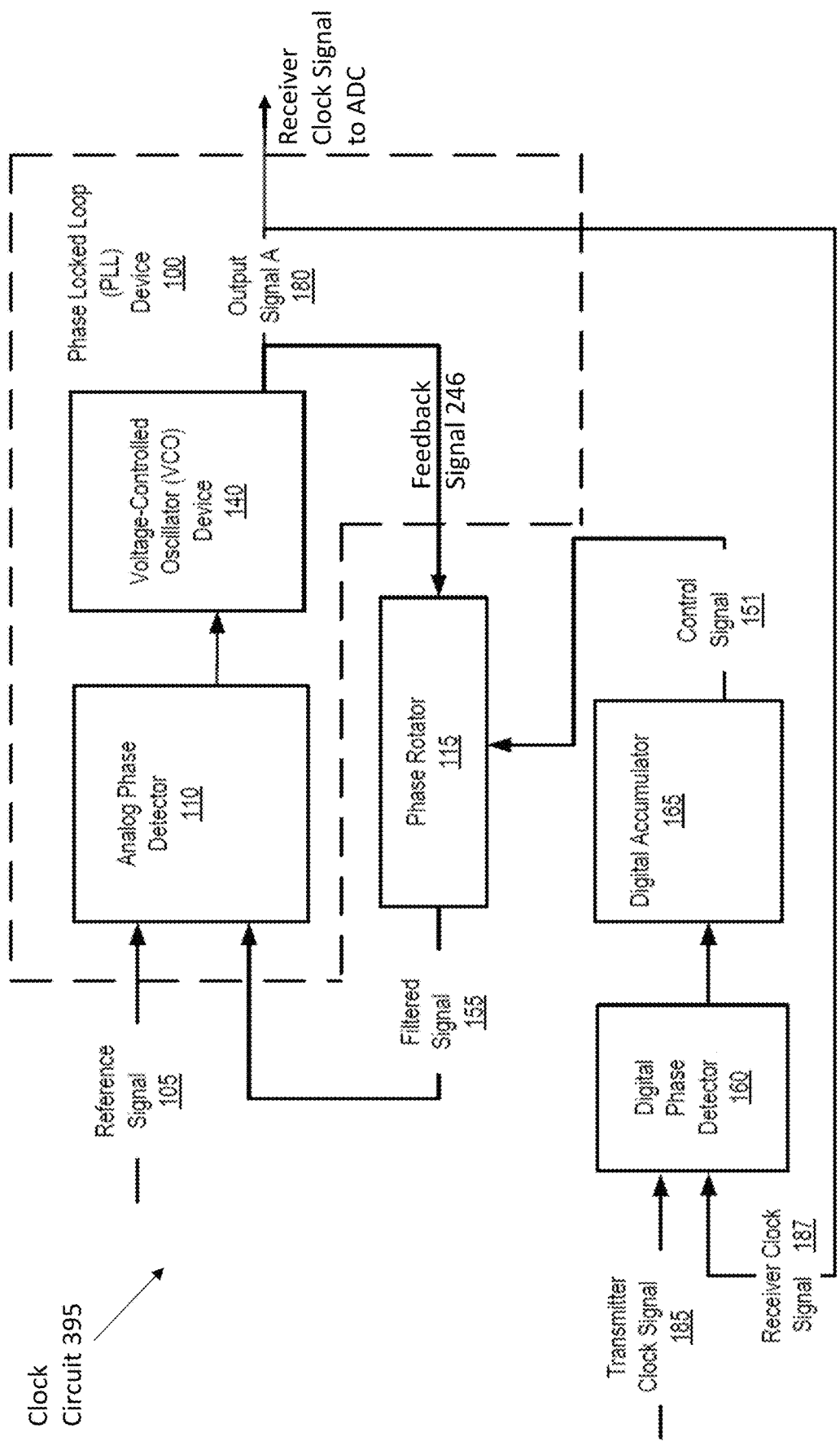
FIG. 3A is a schematic circuit diagram of a clock recovery circuit in a receiver in accordance with the proposed solution.

Some embodiments of the proposed solution relate to a system, apparatus, and a method for clock recovery at a receiver. With reference to FIG. 3A, one or more implementations are directed to a clock recovery circuit 395 which includes a phase rotator 115 disposed within the feedback loop of a phase locked loop (PLL) device 100. A digital phase detector 160 coupled to the phase rotator 115 is employed to determine a frequency offset and/or phase misalignment between a transmitter clock signal 185, as received at the receiver, and a copy 187 of the output signal 180 of the PLL device 100. The clock circuit 395 provides output signal 180, the synchronized output signal, as a receiver clock signal (187) to an ADC.

A phase rotator 115 is configured to apply a phase shift correction in the feedback loop to reduce the frequency offset and/or phase misalignment between the transmitter clock signal 185 and the receiver clock signal 187. The phase rotator 115 provides filtered signal 155 as the feedback signal to the PLL device 100.

Specifically, the PLL device 100 includes analog phase detector 110, for example an integrated circuit including functionality to determine a difference in phase between two input signals e.g., reference clock signal 105 and filtered signal 155 fed back from the VCO 140 output. The phase rotator based digital clock recovery provided allows the clock circuit 395 to lock to a locally received data signal generated by a remote transmitter PLL locked to a reference clock different from the reference clock (105) of the receiver PLL device 100.

The digital phase detector 160 is employed in the clock circuit 395 to provide clock recovery in a receiver. The digital phase detector 160 includes hardware and/or software that implements functionality to determine an amount of phase difference between transmitter clock signal 185 and the receiver clock signal 187 which is a feedback copy of output signal 180. The clock circuit further includes a digital accumulator 165 coupled to the digital phase detector 160. The phase rotator 115 and the digital accumulator 165, using the amount of phase difference between the transmitter clock signal 185 and the receiver clock signal 187 (output signal 180), filter a portion of the amount of phase difference from another copy 246 of the output signal 180 (feedback divider not shown) to generate a filtered signal 155 which is provided to the analog phase detector 110.

The signal path including the receiver clock signal 187 provided from the PLL device 100 to the digital phase detector 160, the digital phase detector 160, digital accumulator 165, phase rotator 115 and the filtered signal 155 provided as an input the analog phase detector 110 of the PLL device 100, implements a phase rotator digital PLL nested in the feedback loop of the analog PLL 100. The phase rotator digital PLL locks to the transmitter clock signal 185. As mentioned with reference to FIG. 2B above, it is noted that the transmitter clock signal 185 is embedded with the data signal in the signal received over the link. This configuration of clock circuit 395 decouples the high bandwidth requirement of the analog PLL 100 to reject the phase noise of the VCO 140 from the requirement of the clock recovery bandwidth of the phase rotator digital PLL. The phase rotator based digital clock recovery bandwidth is selected to balance jitter tracking with respect to the transmitter clock signal 185 as received vs. jitter rejection of the VCO/PLL jitter.

It is noted that the digital phase detector 160 itself is not a perfect device. In accordance with the proposed solution, digital phase detector error can be reduced through averaging, or integration, the result being understood to provide integral control.

In particular, phase rotator 115 includes hardware providing functionality to adjust a frequency offset and/or phase misalignment between transmitter clock signal 185 and a receiver clock signal 187 (a copy of output signal 180). As such, phase rotator 115 includes one or more hardware components that include functionality to apply a predetermined amount of phase shift to feedback copy 246 of output signal 180 based on control signal 151.

In an implementation a phase rotator includes a pair of variable gain amplifiers that apply predetermined weights to an in-phase (I) component and a quadrature (Q) component of an input signal, a feedback copy of output signal 180. For example, a phase rotator is configured to generate a pair of differential phase signals from its input signal that correspond to the I component (i.e., "I phase signal") and the Q component (i.e., "Q phase signal") of the input signal. In one or more embodiments, for example, the I phase signal and the Q phase signal are expressed using the following equations:

$$Q = A \cos(k\int v(t)dt) = A \cos k\varphi \qquad \text{Equation 1}$$

$$I = A \sin(k\int v(t)dt) = A \sin k\varphi \qquad \text{Equation 2}$$

where A is the amplitude of an output signal from the phase rotator 115, such as filtered signal 155; k is a gain value in the phase rotator, v(t) is the voltage of the input signal, t is the time domain, $\varphi$ is the phase shift applied to feedback signal 246 (output signal 180) by the phase rotator 115. The I phase signal and/or the Q phase signal may be generated within the phase rotator 115 for example by a resistor-capacitor (RC) polyphase network, frequency dividers, and/or a resistor-capacitor pairs. Furthermore, the phase rotator 115 can include an interpolator circuit that generates a linear summation of the I phase signal and the Q phase signal. The phase rotator 115 produces filtered signal 155 with the applied phase shift as its output signal.

Keeping with FIG. 3A, in one or more implementations, the $\varphi$ phase shift of the phase rotator 115 is determined by a control signal 151. For example, the control signal 151 includes a binary signal provided by a multi-bit register that includes functionality to instruct the phase rotator 115 to produce no phase shift or one or more steps of phase shift. More generically, the binary signal includes a bit sequence which determines which step of phase shift is produced by the phase rotator 115 (e.g., '101' corresponds to one amount of phase shift and '001' corresponds to a different amount of phase shift). Furthermore, the phase rotator 115 can be a single-step device, e.g., a single amount of phase shift based on the control signal 151. On the other hand, the phase rotator 115 can be a multi-step device. In a multi-step device, the phase rotator 115 can produce different amounts of phase shift based on a control signal 151. In one or more implementations, for example, the phase rotator 115 produces an approximate phase shift of 100 femtoseconds per step. If the control signal 151 corresponds to two steps, then the phase rotator may produce 200 femtoseconds of phase shift to output signal 180 or feedback copy 246 of output signal 180.

In one or more implementations, the control signal 151 for a phase rotator 115 is based on a frequency offset and/or phase misalignment, typically averages thereof, between a transmitter clock signal 185 and an extracted receiver clock signal 187 (180). As noted above the transmitter clock signal 185 is embedded in the signal received over the link. For example, the transmitter clock signal 185 can be obtained using a Godard extraction algorithm. By way of a more specific example, the digital phase detector 160 includes a Godard digital phase detector that implements the Godard extraction algorithm. For example, in an optical transceiver, the transmitter clock signal 185 can be extracted from the "out-of-band" spectrum of the received signal by applying the Godard phase extraction process on the "out-of-band" frequency spectrum, i.e., in Godard bins of the upper sideband and lower sideband of the frequency spectrum of the received signal. For more information on extracting the transmitter clock signal 185 received within a signal spectrum, see D. Godard, "Passband Timing Recovery in an All-Digital Modem Receiver," IEEE Trans. On Communications, Vol. 26, Issue: 5, May 1978, the entirety of which is incorporated herein by reference. While applying a Godard extraction algorithm is one example for obtaining the transmitter clock signal 185, other timing recovery methods of transmitter clock signals 185 are also contemplated, such as a Gardner timing recovery method. Additional aspects of transmitter clock signal extraction from an input signal are presented in co-pending commonly assigned U.S. patent application Ser. No. 15/795,676, filed Oct. 27, 2017, the entirety of which is incorporated herein by reference.

For example, the control signal 151 provided to phase rotator 115 can be generated by a digital accumulator 165 based on multiple differences provided by the digital phase detector 160. The digital accumulator 165 can include hardware and/or software which provides functionality to store a value of at least one phase difference, for example, in a hardware register. In one or more implementations, the digital accumulator 165 is an integrated circuit which also includes functionality to store various measurements of the difference between a transmitter clock signal 185 and a receiver clock signal 187 (180).

The number of phase differences stored in a time window, averaging of phase differences within the time window, weighting based on phase difference measurements, and phase step selection for the phase rotator 115 to apply can amount to the corresponding integral control provided via control signal 151.

While employing the phase rotator 115 of the proposed solution has been described with respect to clock recovery, the apparatus, clock circuit 395 and signal processing method can also be employed for clock generation to reduce VCO/PLL jitter (not shown) wherein the transmitted clock signal 185 illustrated in FIG. 3A is replaced by a copy of reference clock signal 105.

Notably, selected components of PLL device 100 and notably frequency dividers 145, 147 illustrated in FIG. 1 are not shown in FIG. 3A to simplify description. It is understood that the phase rotator 115 can apply the phase shift to the feedback copy 246 of the output signal 180 for example at the frequency of the reference clock signal 105 or a frequency between that of the reference clock signal 105 and that of the output signal 180. When clock circuit 395 is employed for clock recovery in a receiver, digital phase detector 160 operates at the higher frequencies of the transmitter clock signal 185 and of the receiver clock signal 187. However, when clock circuit 395 is employed in for clock generation in a transmitter (not shown), digital phase detector 160 operates at the lower frequency of the reference clock signal 105 using a feedback divider (not shown) in the feedback signal path between the VCO 140 and the digital phase detector 160.

Look Up Table

As it can be appreciated phase rotator 115 is not a perfect device in that the phase shift correction provided by the phase rotator 115 may introduce PLL noise, such as jitter, into the feedback loop of the PLL device 100.

In one or more embodiments, the I phase signal and the Q phase signal suffer from an I-Q mismatch. For example, the I-Q mismatch may be the result of a feedback divider mismatch if a divider is used to generate the quadrature clocks or a buffer delay mismatch between the paths of the I phase signal and the Q phase signal. Specifically, the I-Q mismatch may produce various non-linearities within a feedback loop of a PLL device. Such non-linearities may generate PLL noise, such as jitter, into the extracted clock signal 187 (output signal 180) as described herein. Likewise, an arctan effect may result from phase interpolation within the phase rotator, and which may also produce various non-linearities within the feedback loop of a PLL device 100. For example, with linear phase interpolation, the coefficients of quadrature clock signals may be varied in a sinusoidal fashion. However, if the coefficients of the quadrature clock signals are varied in a linear fashion (e.g., $A_{cos}+A_{sin}=1$), the linear phase interpolation in the example may result in a non-linear phase interpolation function. Accordingly, the effect of the non-linear phase interpolation function may resemble an arctan function.

Figure 3B:
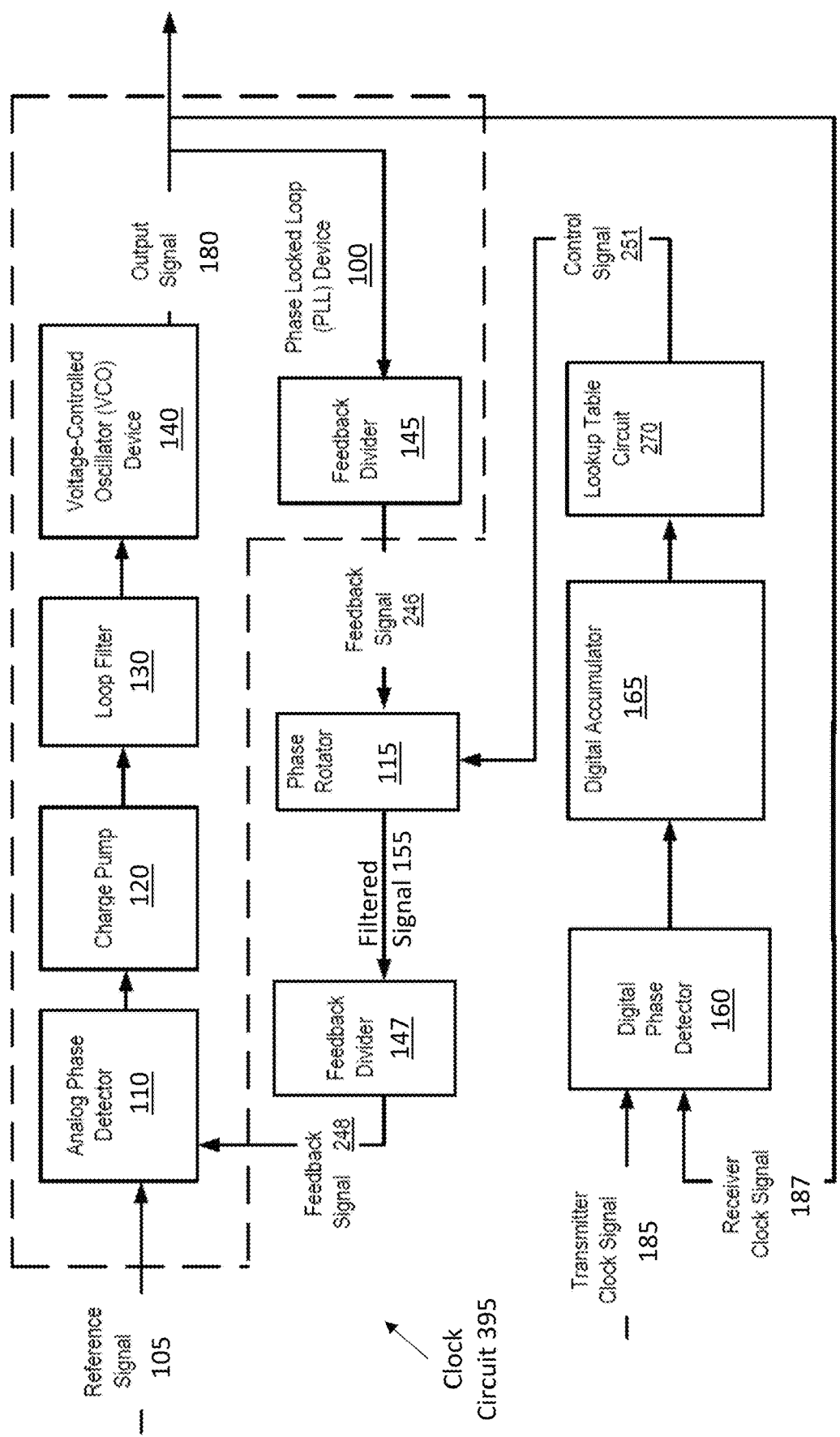
FIG. 3B is a schematic circuit diagram of another clock recovery circuit in a receiver in accordance with the proposed solution.

In one or more implementations, one or more non-linear compensation methods are included in the clock circuit 395 using the phase rotator 115 and the PLL device 100 to account for the PLL noise for example as described below in the accompanying description. One or more components illustrated in FIG. 3B are similar to one or more components described in FIG. 3A and the accompanying description.

In particular, compensation may be provided by a circuit combination, for example, coupled to the PLL device 100 that removes PLL noise based on differences between the transmitter 185 and reference clock signals 187. Such compensation is understood to provide second order control by low pass filtering. In one implementation, for example clock circuit 395 can include a lookup table to tune the phase shift correction of the phase rotator 115 to further reduce PLL noise.

In one or more implementations, a lookup table component 270 is coupled to a phase rotator 115 in a clock circuit 395 to provide non-linear compensation. In particular, the lookup table component 270 includes hardware and/or software which provides functionality to pre-distort the phase shift provided by the phase rotator 115 based on various values obtained from the digital accumulator 165. For example, depending on the phase difference between the transmitter clock signal 185 and the receiver clock signal 187, the lookup table component 270 can determine a corresponding value of a control signal 251 that results in reduced PLL noise within the feedback loop of the PLL device 100. In one implementation, for example, the lookup table component 270 can moderate phase shifts applied by the phase rotator 115 to feedback signal 246. In one or more implementations, the phase shift values of the lookup table component 270 are based on experimental tests of phase rotator 115 operating within a feedback loop of a PLL device 100. For example, the tests can include phase rotator qualification during manufacturing or during the chip screening process.

In one or more implementations, values of the lookup table component 270 are based on measurements of the phase step applied within the feedback loop of PLL device 100. For example, the values 251 of the lookup table component 270 can be obtained for each digital code of control signal 151 that is applied to the phase rotator 115. The measurements of the phase step are configured to discretize the integral non-linearity of the phase rotator 115, which can be cancelled using the lookup table component 270. In one or more implementations, measurements for the lookup table component 270 are obtained (after manufacture) only once and before the clock recovery process is employed, for example, at startup of the component/device (receiver) employing clock circuit 395.

While phase rotator 115 of the proposed solution has been described with respect to clock recovery in FIG. 3B, the apparatus, clock circuit 395 and non-linear compensation signal processing method can also be employed for clock generation to reduce VCO/PLL jitter (not shown) wherein the transmitted clock signal 185 illustrated in FIG. 3B is replaced by a copy of reference clock signal 105.

Notably, more components of PLL device 100 and notably frequency dividers 145, 147 are illustrated in FIG. 3B. Phase rotator 115 is illustrated applying the phase shift to the feedback copy 246 of the output signal 180 at a frequency between that of the reference clock signal 105 and of the frequency of output signal 180. When clock circuit 395 is employed for clock recovery in a receiver, digital phase detector 160 operates at the higher frequencies of the transmitter clock signal 185 and of the receiver clock signal 187. However, when clock circuit 395 is employed in for clock generation in a transmitter (not shown), digital phase detector 160 operates at the lower frequency of the reference clock signal 105 using a feedback divider in the feedback signal path between the VCO 140 and the digital phase detector 160.

Delay Element

In accordance with other implementations of the proposed solution, a delay element can be employed in the feedback loop of the PLL device for jitter removal.

Figure 4:
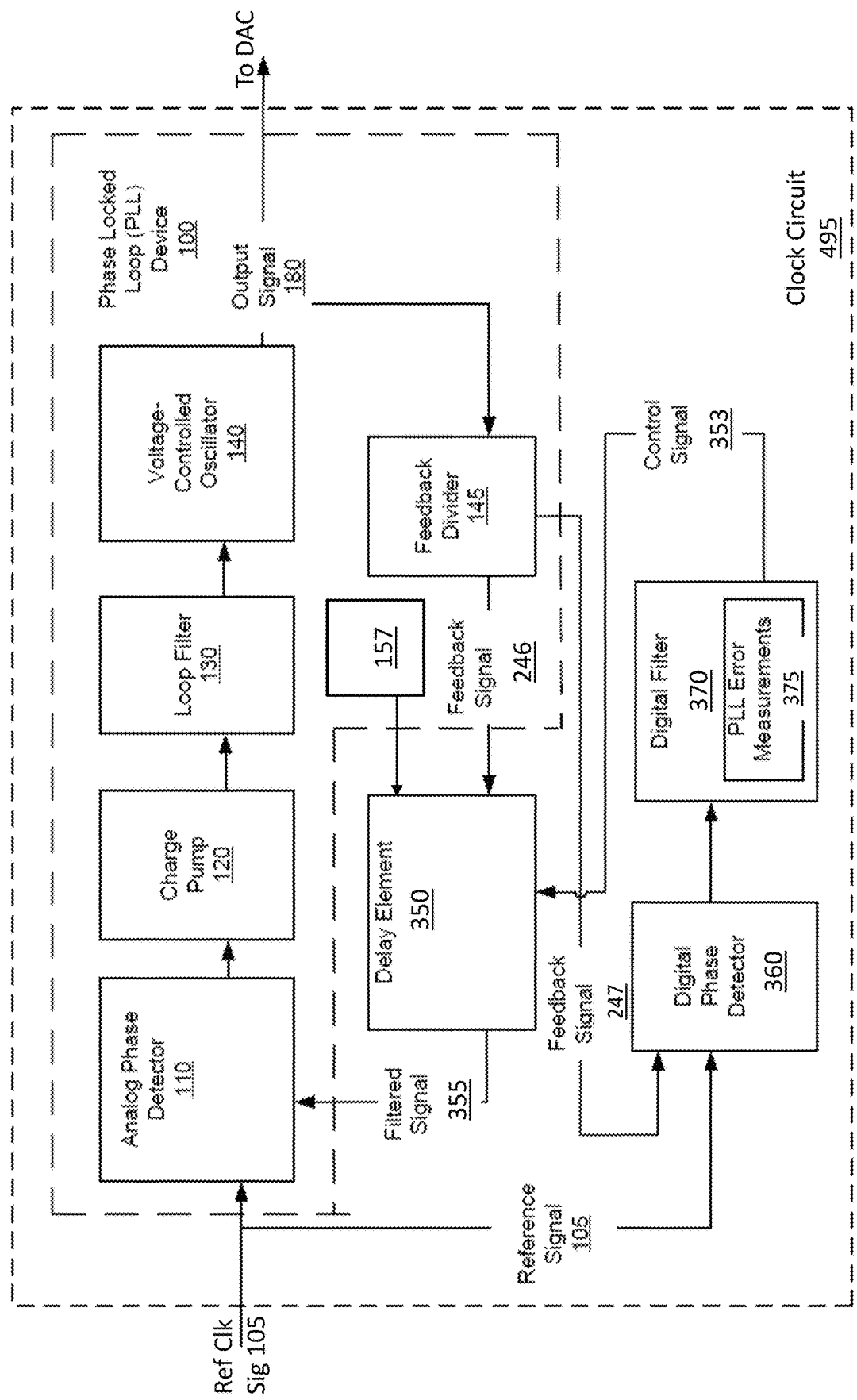
FIG. 4 is a schematic circuit diagram of a clock recovery circuit in a transmitter in accordance with the proposed solution.

FIG. 4 illustrates a block diagram of a system, apparatus and clock circuit in accordance with one or more embodiments of the proposed solution. As shown in FIG. 4, a clock circuit 495 includes a PLL device 100 having components similar to components illustrated in FIG. 1 and described in the accompanying description. Further components such as, but not limited to, digital phase detector 360 may be similar to digital phase detector 160 of FIGS. 3A, 3B, etc.

A digital filter 370 and delay element 350 are operably connected to digital phase detector 360 to filter out noise from feedback signal 247 which is a copy of output signal 180 of the PLL device 100 obtained using feedback divider 145.

The delay element 350 includes hardware and/or software that provides functionality to filter noise from feedback signal 246 (copy of output signal 180) using a digital filter 370. For example, the delay element 350 is a digitally programmable device which includes functionality to adjust the rising edge or falling edge of the feedback copy 246 of the output signal 180 within a predefined bandwidth range with a fine resolution. Thus, the delay element 350 is configured to remove at least a portion of signal noise resulting from the operation of the PLL device 100.

In particular, in a transmitter the signal noise can include PLL error, such as jitter, produced by various components of the PLL device 100. Digital phase detector 360 is operably connected to a digital filter 370. In the transmitter clock circuit 495, the digital phase detector 360 determines a difference in phase between the reference signal 105 and feedback copy 247 of the output signal 180. As clock circuit 495 is employed for clock generation in a transmitter, digital phase detector 360 operates at the lower frequency of the reference clock signal 105.

The digital filter 370 can include hardware and/or software providing functionality to filter the feedback signal 247. Digital filter 370 includes functionality to filter a signal output by the digital phase detector 360. For example, the digital filter 370 is an integrated circuit that includes functionality to store the difference in phase as various PLL error measurements 375, such as in hardware registers. Using the stored PLL error measurements 375, the digital filter 370 can include functionality to generate a control signal 353 for operating the delay element 350 on another copy of the output signal 180 for example feedback signal 246 in the PLL loop of the PLL device 100.

Control signal 353 can be similar to control signal 151 described in FIG. 3A and the accompanying description. For example in one or more implementations, the digital filter 370 is a digital accumulator. Using the PLL error measurements 375, such a digital accumulator can include functionality to produce a code signal for operating delay element 350. For example, code control signal 353 can include a binary code that designates the degree to which the delay element 350 moves the rising edge of the feedback signal 246 in time. If the digital accumulator produces a code signal with a '1', then the delay element 350 can delay the feedback signal 246 by a specific amount of time. If the code signal is a '0', then the delay element 350 can advance the feedback signal 246 by a specific amount of time.

However, other implementations are contemplated with other code sequences such as multi-bit code sequences (e.g., "1001") that correspond to a specific amount of phase delay or an amount of phase advance to be applied to the feedback signal 246 by the delay element 350. In such implementations, the delay element 350 provides PLL error filtering that is independent of the frequency of the reference signal 105. For example, the quality of the reference signal 105 may be fixed by an availability of parts or a technology standard. Thus, the delay element 350 can remove PLL jitter within the output signal 180, without a changing the bandwidth of operation of the PLL device 100. In one or more implementations, the delay element 350 has a resolution as large as the peak-to-peak PLL jitter of the PLL device, which provides increased jitter suppression capability for the PLL device.

In one or more implementations, the delay element 350 operates subject to the output of steady-state detector 157 illustrated in and described with reference to FIG. 1. For example, delay element 350 includes functionality to operate only while the output signal 180 is locked to the reference signal 105. When the PLL device 100 is in transient mode the output of steady-state detector 157 causes the delay element 350 to enter a transparent mode. In a transparent mode, the delay element 350 can pass feedback signal 246 to PLL device 100 to allow the PLL device 100 to adjust the phase and/or frequency of the output signal 180 to match the reference signal 105.

In one or more implementations, the digital phase detector 360 has a smaller resolution than a sampling rate resolution of the PLL device 100. For example, the digital phase detector 360 can include a bang-bang arbiter with a resolution approximately 50 femtoseconds or less, and a bandwidth range of a few picoseconds. The sampling rate of the PLL device can correspond to the frequency of the voltage-controlled oscillator 140 inside the PLL device 100 that is used to generate the output signal 180.

In accordance with other implementations, the delay element 350 and the digital filter 370 can implement an analog time-domain filter in the PLL feedback loop. Accordingly, the delay element 350 and the digital filter 370 can remove various low frequency signals from the feedback signal 246 producing an analog filtered signal 355. Thus, the analog filtered signal 355 is provided as an input to an analog phase detector 110 in the PLL device 100 for producing output signal 180 with reduced PLL jitter. In some implementations, the delay element 350 can be an analog device itself; in such implementations an analog anti-imaging filter can be implemented using a DAC. Additional aspects employing an analog delay element in the feedback signal path are presented in co-pending commonly assigned U.S. patent application Ser. No. 15/489,221, filed Apr. 17, 2017, the entirety of which is incorporated herein by reference.

While the delay element 350 of the proposed solution has been described with respect to clock generation in a transmitter, the apparatus, clock circuit 495 and corresponding signal processing method can also be employed for clock extraction/recovery in a receiver (not shown) to track a transmitter clock signal 185 as received, wherein the copy of reference clock signal 105 provided to the digital phase detector 360 is replaced by transmitted clock signal 185. When clock circuit 495 is employed for clock recovery in a receiver, digital phase detector 360 operates at the higher frequencies of the transmitter clock signal 185 or of the feedback signal 247.

Combination of Phase Rotator and Delay Element with Dual Digital Phase Detectors While FIGS. 1 to 4 illustrate various configurations of components, the components can be used in other configurations without departing from the scope of the proposed solution. For example, various components can be combined to create a single component. As another example, the functionality performed by a single component can be performed by two or more components. Accordingly, for at least the above-recited reasons, embodiments of the proposed solution should not be considered limited to the specific arrangements of components and/or elements shown in FIGS. 1 to 4.

Figure 5:
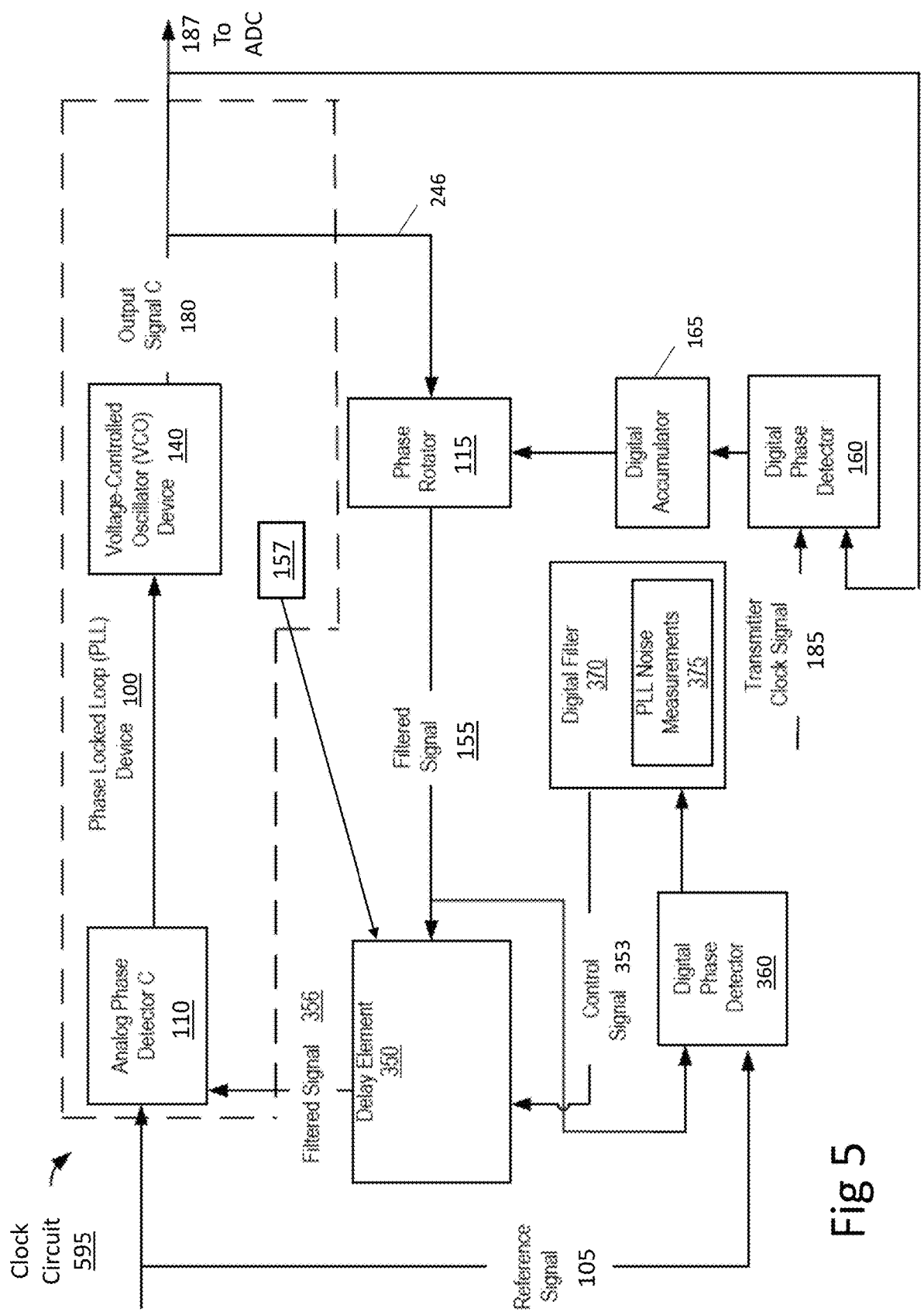
FIG. 5 is a schematic circuit diagram of a clock recovery circuit showing decoupling between clock recovery and jitter cancellation.

Commonly assigned, U.S. Pat. No. 10,063,367, issued Aug. 28, 2018, the entirety of which is incorporated herein by reference, describes a clock circuit 595 employed in a receiver as illustrated in FIG. 5. The phase rotator 115 is operably connected to delay element 350 in accordance with a compensation method wherein the delay element 350 compensates for PLL jitter and as well compensates for some phase rotator 115 errors. Notably, the phase rotator 115 is employed in a clock recovery loop as illustrated in FIG. 3A, 3B, while the delay element 350 is employed in a PLL jitter cancellation loop.

Delay element 350 is hardware and/or software including functionality to filter noise from filtered signal 155 using digital filter 370 to produce filtered signal 356 at its output. The delay element 350 can remove at least a portion of noise in the filtered signal 155 prefiltered by the phase rotator 115 resulting from the operation the phase rotator 115 and from the PLL device 100. Overall, the delay element 350 can remove PLL noise from the phase of the output signal 180 via filtered signal 155.

In one or more implementations, the delay element 350 is coupled to a digital filter 370. Digital filter 370 includes functionality to use the difference in phase between a copy of reference signal 105 and a copy of filtered signal 155 obtained by digital phase detector 360. For example, digital filter 370 is an integrated circuit that includes functionality to store the difference in phase for example as various PLL noise measurements 375, for example in hardware registers. Using the stored PLL noise measurements 375 the digital filter 370 can include functionality to generate control signal 353 for operating the delay element 350 on filtered signal 155.

For example, digital filter 370 can include a digital accumulator (not shown). Using the PLL noise measurements 375, the digital accumulator can include functionality to produce control signal 353 for operating the delay element 350.

Notably, in a receiver clock recovery provided through digital phase detector 160, digital accumulator 165 and phase rotator 115 is decoupled from PLL jitter rejection/cancellation provided by digital phase detector 360, digital filter 370, and delay element 350. This combination of components in clock circuit 595 provides a higher order jitter rejection overall.

As mentioned hereinabove, use of clock circuit 595 in a transmitter (not shown) includes providing another copy of reference clock signal 105 to digital phase detector 160 instead of transmitter clock signal 185, and employing appropriate feedback dividers for operation of the digital phase detector 160 at the frequency of the reference clock signal 105.

While higher order jitter rejection is provided for a PLL device 100, the signal processing provided employs a large implementation area on a digital signal processing chip for example implementing dual digital phase detectors 160, 360, dual digital accumulators 165, 370, etc.

VCO Emulation

In accordance with the proposed solution, apparatus, clock circuit and jitter rejection methods are provided which emulate digitally the operation of a VCO with a digital accumulator followed by segmented controls providing proportional control and integral control functions in a PLL feedback loop. A combination of a phase rotator and an accumulator is employed to perform frequency tracking providing the integral control, and a digital fine delay element is employed to perform phase tracking providing the proportional control. Cascading the integral control function in the PLL loop provided by the phase rotator and proportional control function provided by the delay element provides $2^{nd}$ order control in a PLL feedback loop.

Figure 6A:
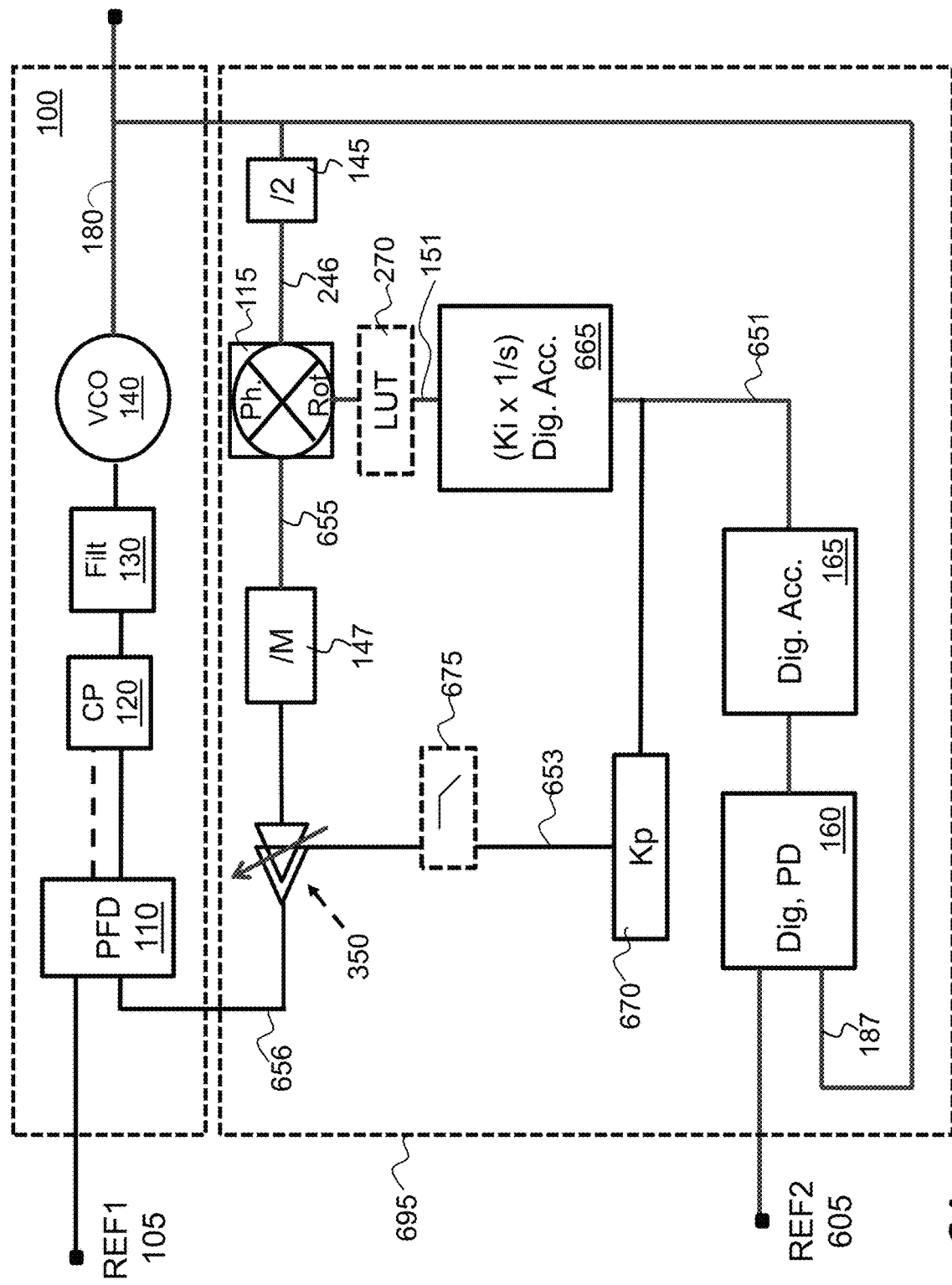
FIG. 6A is a schematic circuit diagram of a generic clock recovery circuit showing decoupling between clock recovery and jitter cancellation in accordance with the proposed solution.

FIG. 6A, illustrates a generalized clock circuit 695 employing dual reference clock inputs to provide high order phase tracking for jitter rejection/cancellation and clock recovery implementations. In accordance with the proposed solution, high order phase tracking clock circuit 695 is employed in the feedback loop of PLL device 100 indirectly controlling the VCO 140. Copy 187 of the output signal 180 of the PLL device 100 is compared with a second reference clock signal 605 at a digital phase detector 160. With reference to description hereinabove, phase differences detected by digital phase detector 160 are provided to digital accumulator 165. As described hereinabove, digital accumulator 165 performs numerical integration; wherein integration of frequency results in phase information, providing a control signal 651. For example, in some implementations control signal 651 is an alternating current (AC) signal wherein the mean value characteristic (also referred to as the DC component) indicates a frequency difference between a copy of output signal 187 (at least initially more synchronized to the reference clock signal 105) and reference clock signal 605. Oscillating characteristics of AC control signal 651 are indicative of dynamic jitter between reference clock signal 605 and the copy of output signal 187. As another implementation example, phase information can be encoded in a digital signal 651 which may include a bit pattern corresponding to at least one phase difference detected within a time window. Details of bit pattern encoding for digital signal 651 can be similar to description hereinabove with respect to controls signals 151. 251, 353, etc.

A copy of control signal 651 is provided to drive a digitally controlled delay locked loop (DLL) component or a component capable of introducing 2 Pi rotations in the feedback signal 246 in the feedback path of the PLL device 100. For example, a second digital accumulator 665, for example of "Ki×1/s" type, performs a second numerical integration providing control signal 151 for driving phase rotator 115 for example as described hereinabove. This integral control feedback control loop nested within the feedback loop of PLL device 100, is employed for slow frequency compensation which over time (over multiple signal feedback loop cycles) preferentially identifies the center frequency of reference clock signal 605 and, through the feedback loop of the PLL device 100, indirectly adjusts the oscillation frequency of the VCO 140 to match the frequency of reference clock signal 605. As mentioned hereinabove, components in this integral feedback control path are not perfect, some residual non-linearities can be corrected by optionally employing look up table (LUT) component 270. The integral control feedback control provides filtered feedback signal 655 which can have remaining low-frequency jitter (spurs) for example originating from the operation of the phase rotator 115.

Another copy of control signal 651 is provided to a "Kp" component 670, for example a digital gain block such as a multiplier, which outputs digital control signal 653. Digital control signal 653 is employed to drive fine delay element 350. For example as described hereinabove, digital control signal 653 can include a digital bit pattern. Delay element 350 is employed to provide phase non-linearity correction by advancing or retarding a (raising or falling) transition of filtered signal 655, in time, to provide filtered feedback signal 656 to the PLL device 100, for example to (analog) phase detector 110. The phase non-linearity correction provides the proportional control. In some implementations, fine delay element 350 can include an analog device wherein an analog anti-imaging filter 675 (shown in dashed outline), for example a DAC converts digital signal 653 into an analog drive signal to drive such an analog fine delay element 350. Specific implementations can employ a voltage controlled fine/linear delay element 350 having a resolution of about 20 fs and a range of about 5 ps.

With filtered signal 655 being provided as an input to fine delay element 350, residual non-linearity from the control path can be corrected via the fine proportional control path by applying a high-pass transfer function attenuating low frequency spurs.

Notably, employing a single digital phase detector 160 for both the integral and proportional phase control paths reduces implementation area and power requirements in a component employing clock circuit 695.

The 2nd order phase tracking loop operation of clock circuit 695 in the phase domain is illustrated with reference to FIG. 6B. The method and apparatus employ digital accumulator 165 to mimic a VCO pole in the phase domain. The emulated VCO (165) is modelled as an integrator block "1/s" performing integration in the phase domain. The control signal path splits to provide segmented controls: an integral control signal path using digital accumulator 665 (driving the phase rotator 115), and a fine proportional control path using digital filter (Kp) 670 (driving fine resolution digitally controlled delay element 350). The cascading of the phase rotator 115 with the fine delay element 350 illustrated in FIG. 6A performs intrinsic summation "+" in the phase domain. While the digital accumulator "Ki/s" 665 indirectly controls the VCO 140 to match the center frequency of the reference clock signal 605, thus adjusting a static offset, digital filter Kp 670 indirectly controls the VCO 140 to dynamically remove (attenuate) spurs caused by non-linearities of the phase rotator (i.e. tracking the AC around the jitter mean).

Figure 6B:
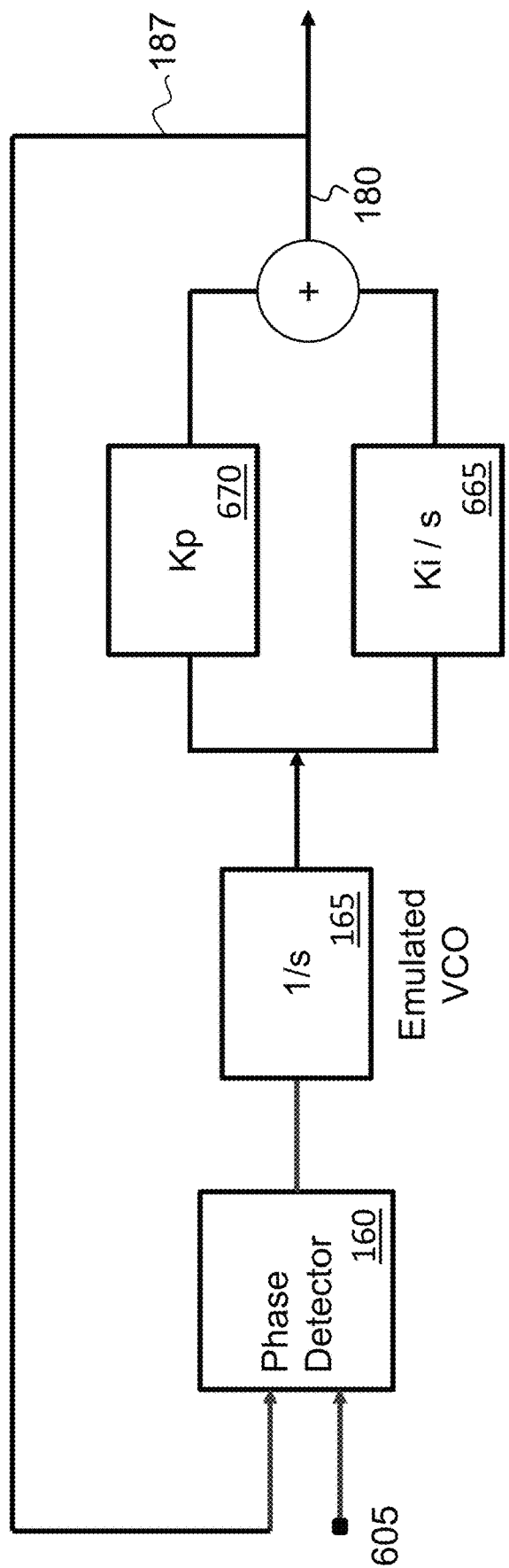
FIG. 6B is a schematic signal processing diagram of a generic clock recovery circuit showing decoupling between clock recovery/generation and jitter cancellation in accordance with the proposed solution.
Figure 6C:
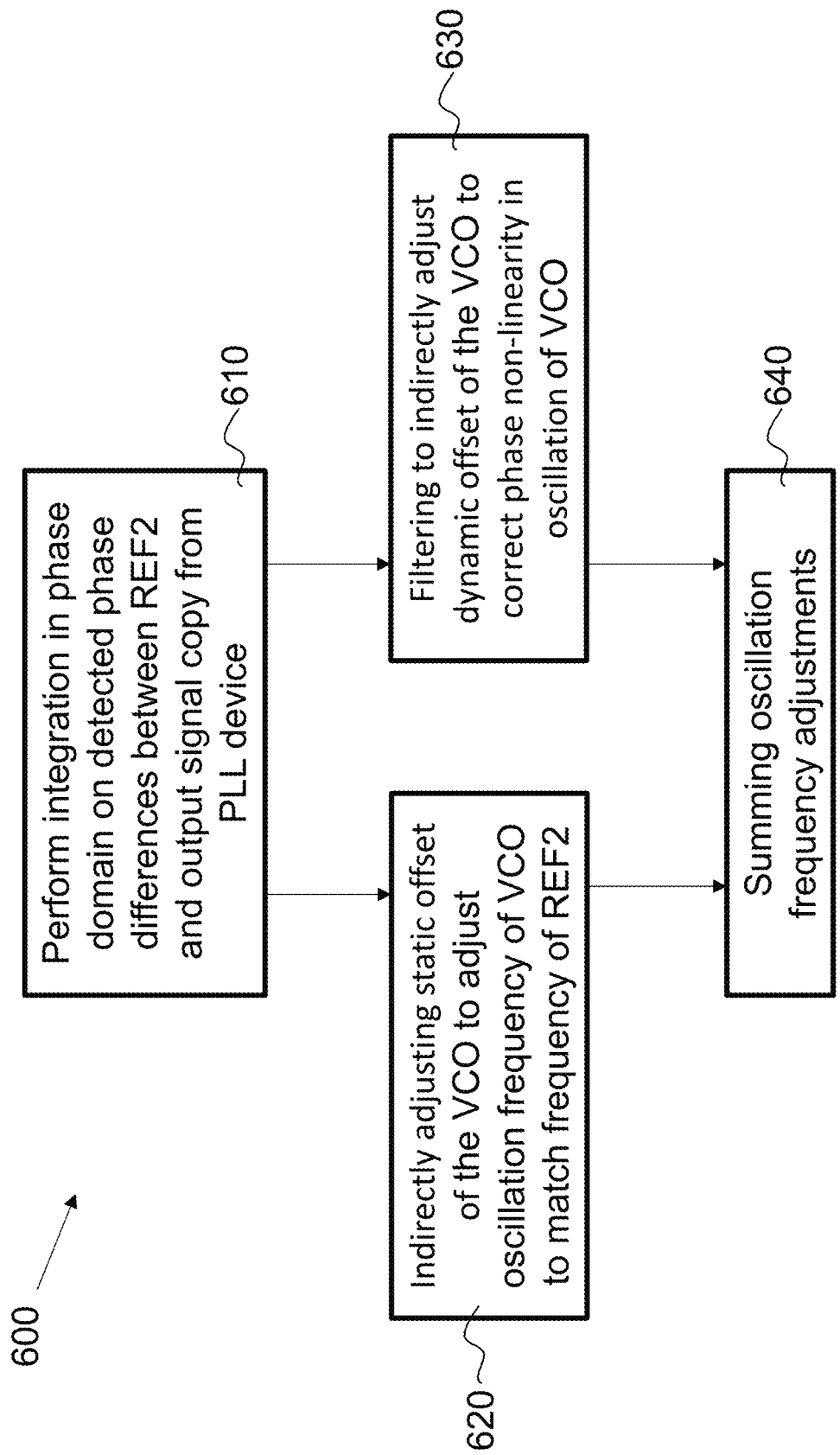
FIG. 6C is a schematic flowchart of a method of signal processing in accordance with one or more embodiments.

FIG. 6C illustrates a method 600 of signal processing in clock circuit 695 in accordance with the proposed solution. Specifically, one or more steps in FIG. 6C may be performed by one or more components as described in FIG. 6A with reference to FIG. 6B. While the various steps in this flowchart are introduced and described sequentially, one of ordinary skill in the art will appreciate that some or all of the steps may be executed in different orders, may be combined or omitted, and some or all of the steps may be executed in parallel. Furthermore, the steps may be performed actively or passively.

Integration in the phase domain is performed 610 on detected phase differences between reference clock signal 605 and output signal copy 187 from PLL device 100 to provide control signal 651. A static offset of the VCO 140 is adjusted 620 indirectly to change the oscillation frequency of VCO 140 to match the frequency of reference clock signal 605. Control signal 651 is (digitally) filtered 630 to indirectly adjust a dynamic offset of the VCO 140 to correct the oscillation of VCO 140 to provide phase non-linearity correction. Summing 640 oscillation frequency adjustments attenuates oscillation frequency components in the oscillation of VCO 140 to provide phase non-linearity correction.

As such, the method 600 performed by circuit 695 is understood to turn the control mechanism shown in FIG. 6B into digital implementation which uses the best of phase rotator operational characteristics (infinite range as phase rotation repeats/resets when) 360°=0° and fine delay element operational characteristics (granularity/resolution). The former is controlled via the integral control path to remove steady state error (second order loop characteristics) and the latter is controlled via the proportional control path (phase control which dominates the bandwidth of the overall PLL feedback control loop) to track instantaneous phase dithering. In accordance with the proposed solution, the proportional PLL feedback control path addresses (corrects/fixes) shortcomings of the integral PLL feedback control path.

The circuit template of clock circuit 695 illustrated in FIG. 6A can be employed to act as a PLL jitter cleaner, (preferably to act as a PLL jitter canceler) for clock generation implementations. With reference to description hereinabove, transmitter component implementations employ clock generation. In other embodiments, clock generation implementations can be used to drive clock trees (not shown).

Figure 7A:
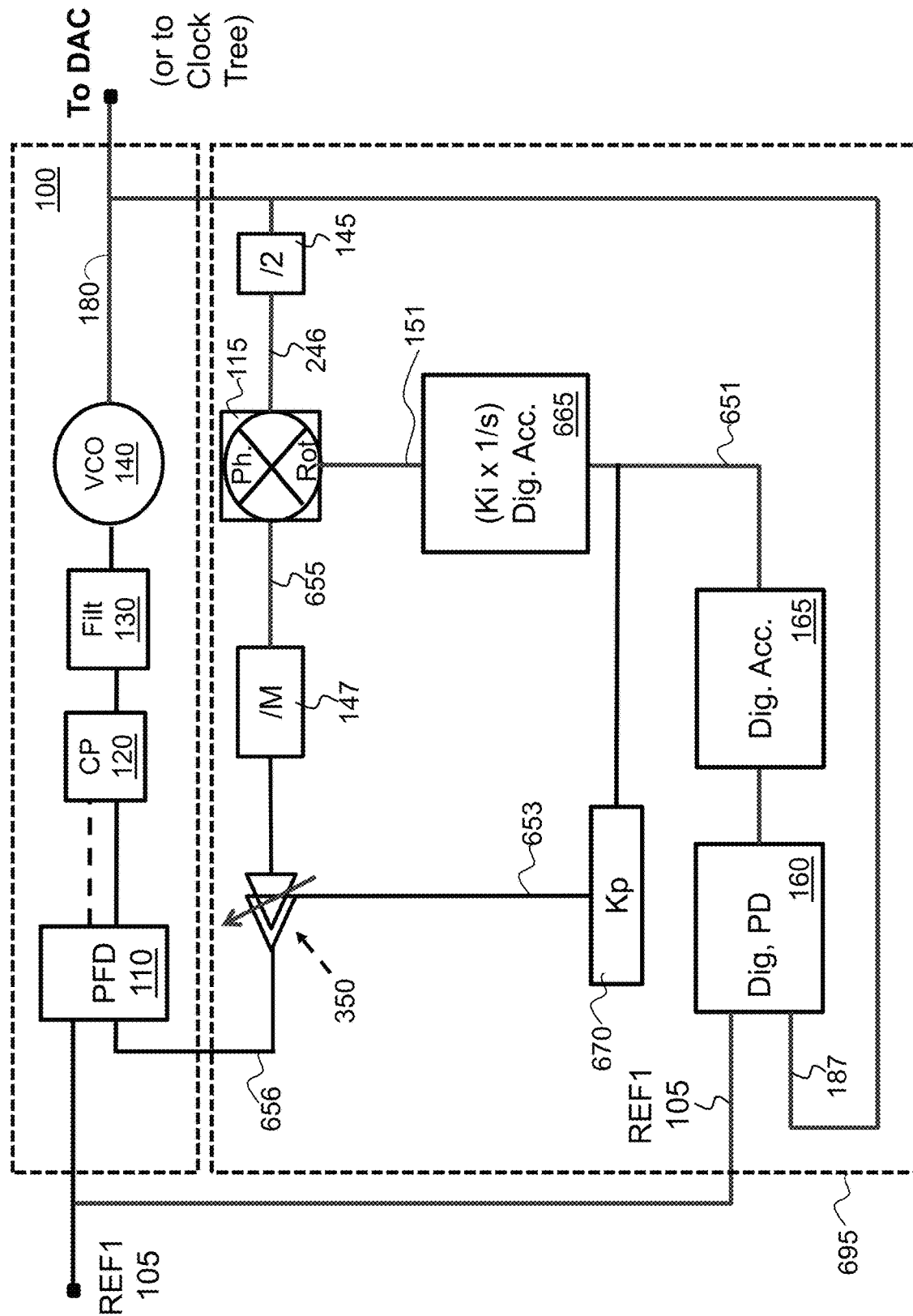
FIG. 7A is a schematic circuit diagram of the generic clock circuit employed in a transmitter providing clock generation and jitter cancellation in accordance with the proposed solution.

With reference to FIG. 7A, clock circuit 695 template generically illustrated in FIG. 6A is employed for clock generation in a transmitter component with the objective to reduce/suppress jitter in VCO 140. By supplying a copy reference clock signal 105 to the digital phase detector 160 as the second reference clock signal 605, high order jitter suppression in the VCO output signal 180 can be provided. Preferably, the 2nd order phase control provided by clock circuit 695 described hereinabove follows (tracking) clean reference clock 105 to reduce jitter at the VCO output 180. As such, the combination of the PLL device 100 and clock circuit 695 operates as a digital VCO with segmented proportional and integral controls in a $2^{nd}$ order phase control loop to provide clock generation.

While the synchronized output signal 180 is illustrated to be employed (fed) to provide cadence to (drive) a DAC in a transmitter implementation (similar to illustration in FIG. 2A), in other applications (not illustrated) the synchronized output signal 180 can be employed to drive a clock tree.

Figure 7B:
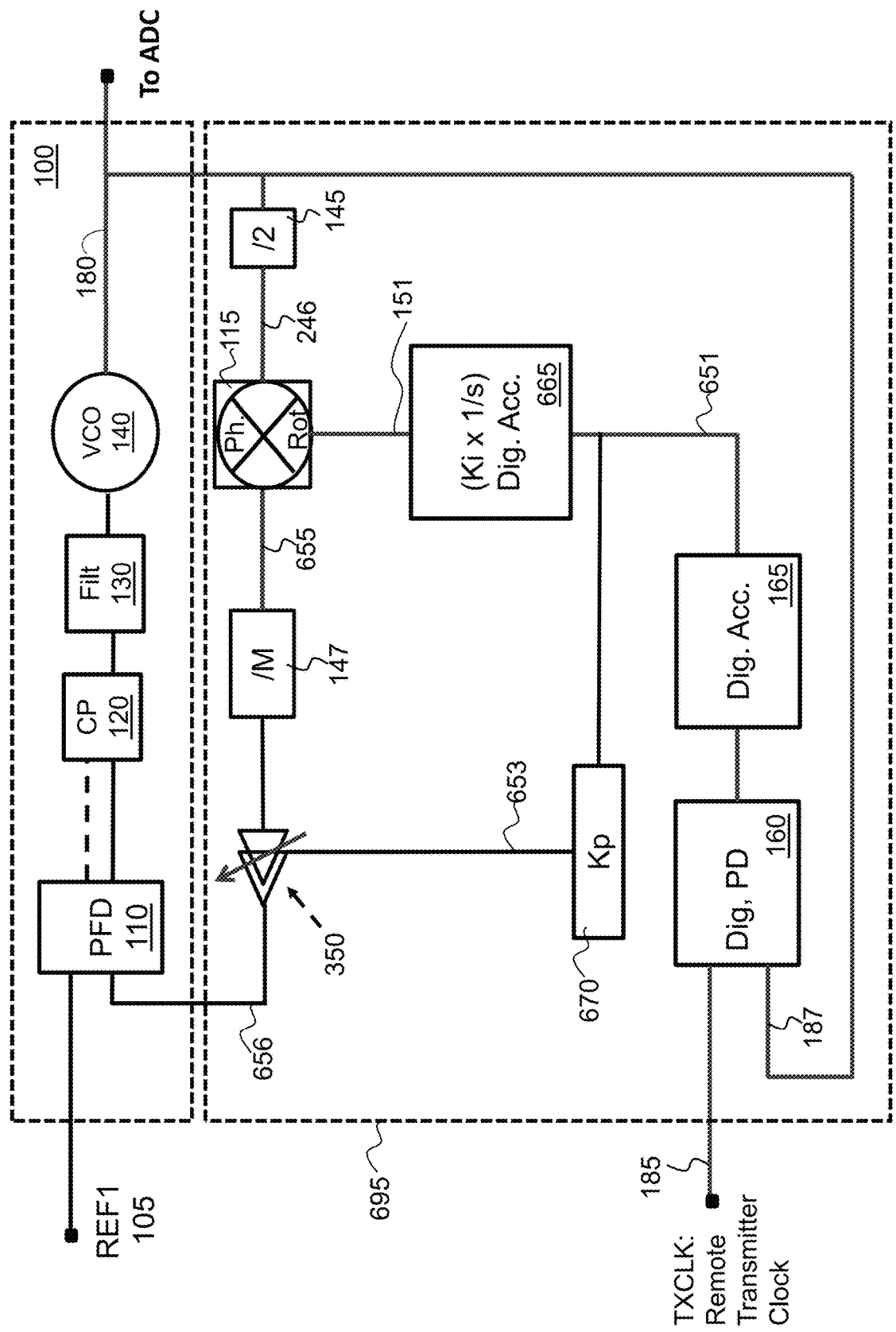
FIG. 7B is a schematic circuit diagram of the generic clock circuit employed in a receiver providing clock extraction/recovery and jitter cancellation in accordance with the proposed solution.

With specific reference to FIG. 7B, clock circuit 695 template generically illustrated in FIG. 6A is employed for clock recovery in a receiver component with the objective to track a remote transmitter clock signal as received. By supplying the received signal 185, typically a copy of the remote transmitter clock signal derived from the received signal, to the digital phase detector 160 as the second reference clock signal 605, the jitter profile of the local VCO 140 can be adjusted to follow the jitter profile of the remote transmitter as detected over the link regardless of signal imperfections. In generic terms, the output signal 180, synchronized to the remote transmitter clock signal 185, is employed to drive an ADC in a receiver implementation (similar to illustration in FIG. 2B) with the objective for the jitter profile of the local ADC VCO 140 to match the jitter profile of the received signal 185. Particularly, employing clock circuit 695 in a receiver, high order clock recovery is provided by improved tracking of the remote (foreign) transmitter clock. Preferably, the 2nd order phase control provided by clock circuit 695 described hereinabove follows (tracking) departures of remote (foreign) transmitter clock from ideal (FIG. 1B and accompanying description). As such, the combination of the PLL device 100 and clock circuit 695 operates as a digital VCO with segmented proportional and integral controls in a $2^{nd}$ order phase control loop to provide clock extraction.

Employing the proposed solution to provide clock recovery for communication over a link can be appreciated as follows: From the perspective of a receiver, the jitter in the local receiver clock, present in the synchronized clock signal 180, is determined by the jitter properties of remote transmitter PLL (as detected locally from the received signal 185) and the jitter properties of the local receiver PLL (imperfect components). The remote and local jitter contributions can be addressed independently to achieve the best jitter reduction/suppression performance of the overall link. In other words, if the remote transmitter has very low jitter as detected in received signal 185 at the local receiver, the local receiver clock circuit 695 will track the transmitter clock as received and will further attenuate local receiver's clock intrinsic jitter to account for imperfect components in the local PLL loop. Employing the proposed signal processing method at least in the local receiver (with two independent remote transmitter and local receiver clock circuits): has a significant performance advantage in terms of jitter performance compared to legacy/traditional clock recovery schemes (see FIG. 2B) because the jitter control provided with respect to the local PLL loop (the proportional phase control path) is independent of the clock recovery bandwidth (the integral phase control path).

Additionally, by employing clock circuit 695 at least in the local receiver to provide $2^{nd}$ order phase control as proposed herein, the fine resolution delay element used in the proportional control path also rejects (attenuates) low-frequency jitter (spurs) originating from the phase rotator (because the phase rotator follows a high-pass transfer function with respect to the clock recovery function) used in the integral control path.

In one or more embodiments, the transmitter clock signal is an extracted clock signal from a SerDes link. In one or more embodiments, for example, the SerDes system is a PISO (Parallel Input, Serial Output) system that can include a parallel clock input, various data input lines, and various input data latches. As such, the SerDes system may use an internal or external PLL device to multiply the incoming parallel clock up to a specific frequency. In one or more embodiments, the SerDes system is a SIPO (Serial Input, Parallel Output) system. In a SIPO system, the receiver clock signal can be recovered from data obtained using a serial clock recovery technique as described herein.

A receiver employing a single digital phase detector 160 in accordance with the proposed solution benefits from advantages of low power and low jitter clock recovery implementations which are insensitive to ppm differences between the remote transmitter and local receiver clocks. With reference to FIGS. 7B, 6B and 6C, employing $2^{nd}$ order clock recovery methods proposed herein wherein a ppm difference exists between the transmitter clock 185 and receiver reference clock signal 105, reduces the phase error of output signal 180 close to '0' regardless of the ppm difference. Such a ppm offset would generate in-band spurs from the operation of phase rotator 115 in the clock recovery loop. However, employing the segmented proportional phase loop and integral phase loop controls proposed herein suppresses the magnitude (attenuates), and preferably rejects (cancels) such spurs generated by the phase rotator 115. A result is that the recovered clock absolute phase does not change with respect to the transmitter clock phase.

System analysis to ensure stability of the proposed solution was undertaken using low frequency crystals as reference clock sources with acceptable phase noise. High frequency generators were locked to the reference clock sources to drive sampling for the system analysis. Both time and frequency domain models were used to study acquisition and steady-state behaviors respectively. The stability analysis showed that the clock circuits and signal processing methods proposed herein have a good margin in terms of step/frequency responses providing better jitter performance compared to conventional systems and methods. The operation of clock circuit 695 can be successfully stabilized for a selection of parameters satisfying operational requirements with good margins. The frequency response in terms of the emulated VCO phase noise from Digital PLL output 655 is governed by a high-pass filter (see integral phase control path description hereinabove). The frequency response in terms of noise added by the phase rotator output through to the DPLL output 655 is bandpass (see proportional phase control path description hereinabove), and no poles of the closed loop phase control lie outside the unit circle in the complex plane. This confirms system stability.

Figure 2B:
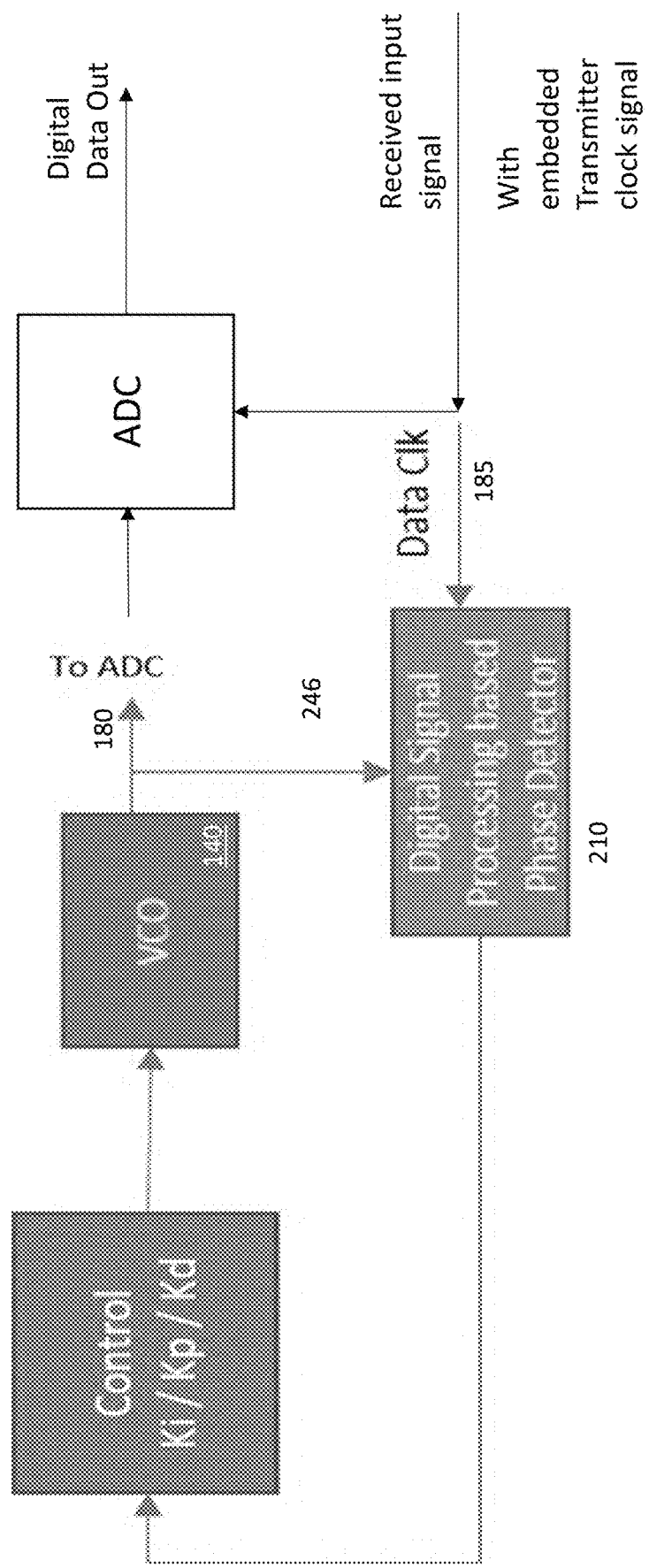
FIG. 2B is a schematic circuit diagram illustrating a simplified prior art receiver.
Figure 2C:
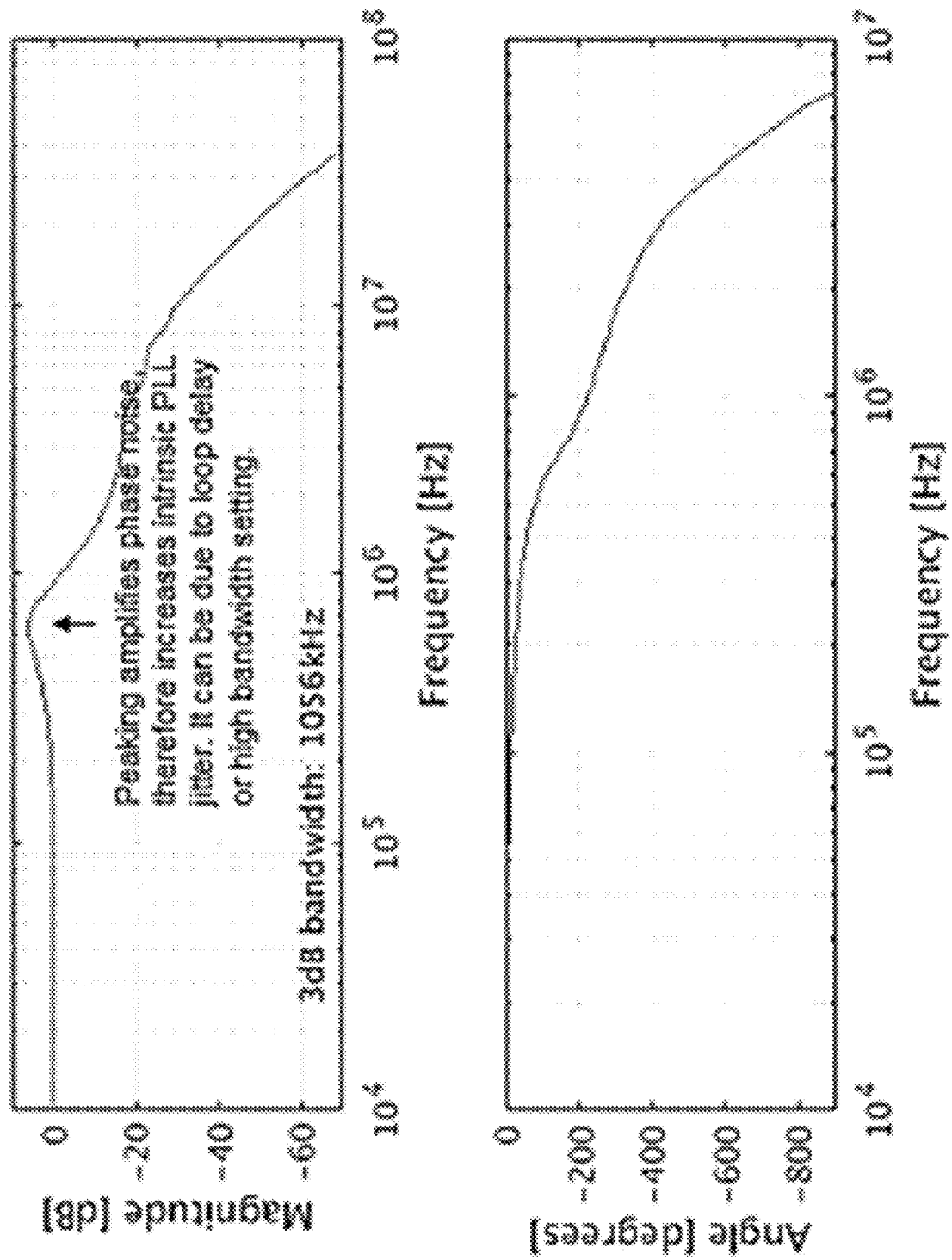
FIG. 2C includes schematic plots illustrating excessive peaking in prior art receivers.

The proposed clock circuits, components and signal processing methods, based on the quantitative analysis and results presented herein, when implemented particularly, but not exclusively, in receiver components provide improved clock recovery performance which can also be understood as reducing a likelihood of cycle slips during clock extraction when compared to conventional clock extraction (FIG. 2B). Such reduced likelihood of cycle slips improves tolerance of ppm differences between transmitter and receiver clocks, improved tolerance which is reflected in reduced signal-to-noise ratio (SNR) with respect to a received signal. Long haul applications where reach is limited by SNR and jitter would benefit particularly. Further, the clock circuits, receiver components and signal processing methods proposed herein provide an ADC with sampling clock signals having reduced jitter improving overall SNDR of data converters.

The proposed clock circuits, components and signal processing methods presented herein provide a very small controllable clock recovery bandwidth when compared to conventional schemes. The fine clock recovery bandwidth control provided herein has high potential in flex-grid/gridless system (liquid spectrum) applications as the clock recovery band (the outer band of a channel signal spectrum) is desensitized to adjacent channel energy (robust to neighboring channel interference). This advantage is twofold: it allows for more compact channel spacing, and reduces both clock jitter and overall bit error rate. In turn, these advantages can potentially enable richer and/or higher modulation formats to be employed over communications links.

Figure 8:
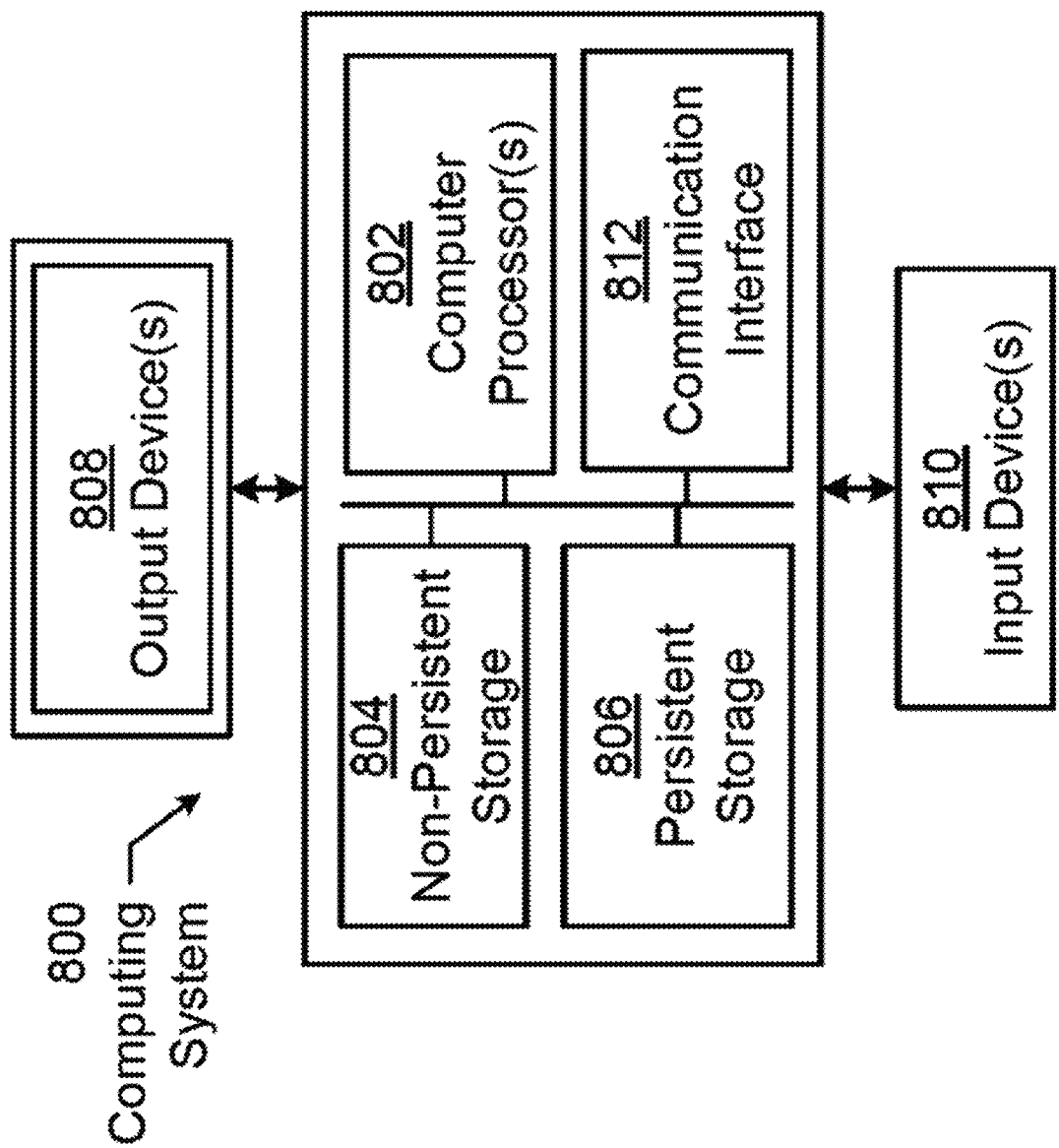
FIG. 8 illustrates a computing system in accordance with one or more embodiments.

Embodiments may be implemented in a clock circuit of a computing system. Any combination of mobile, desktop, server, router, switch, embedded device, or other types of hardware may employ such a clock circuit. For example, as shown in FIG. 8, the computing system 800 may include one or more computer processors 802, non-persistent storage 804 (e.g., volatile memory, such as random access memory (RAM), cache memory), persistent storage 806 (e.g., a hard disk, an optical drive such as a compact disk (CD) drive or digital versatile disk (DVD) drive, a flash memory, etc.), a communication interface 812 (e.g., Bluetooth interface, infrared interface, network interface, optical interface, etc.), and numerous other elements and functionalities.

The computer processor(s) 802 may be an integrated circuit for processing instructions. For example, the computer processor(s) may be one or more cores or micro-cores of a processor. The computing system 800 may also include one or more input devices 810, such as a touchscreen, keyboard, mouse, microphone, touchpad, electronic pen, or any other type of input device.

The communication interface 812 may include an integrated circuit for connecting the computing system 800 to a network (not shown) (e.g., a local area network (LAN), a wide area network (WAN) such as the Internet, mobile network, or any other type of network) and/or to another device, such as another computing device.

Further, the computing system 800 may include one or more output devices 808, such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) 802, non-persistent storage 804, and persistent storage 806. Many different types of computing systems exist, and the aforementioned input and output device(s) may take other forms.

Software/firmware instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software/firmware instructions may correspond to computer readable program code that, when executed by a processor(s), is configured to perform one or more embodiments of the proposed solution. For clarity, state machine logic may implement and/or include such and/or other instructions for implementing and/or may be configured to perform one or more embodiments of the proposed solution.

The computing system or group of computing systems described in FIG. 8 may include functionality to perform a variety of operations disclosed herein. For example, the computing system(s) may perform communication between processes on the same or different systems. A variety of mechanisms, employing some form of active or passive communication, may facilitate the exchange of data between processes on the same device. Examples representative of these inter-process communications include, but are not limited to, the implementation of a file, a signal, a socket, a message queue, a pipeline, a semaphore, shared memory, message passing, and a memory-mapped file. Some further details pertaining to a couple of such non-limiting examples are provided below.

Based on a client-server networking model, sockets may serve as interfaces or communication channel end-points enabling bidirectional data transfer between processes on the same device. Following the client-server networking model, a server process (e.g., a process that provides data) may create a first socket object. Next, the server process binds the first socket object, thereby associating the first socket object with a unique name and/or address. After creating and binding the first socket object, the server process then waits and listens for incoming connection requests from one or more client processes (e.g., processes that seek data). At this point, when a client process wishes to obtain data from a server process an established connection informs the client process that communications may commence. Upon receiving a data request, the server process analyzes the request and gathers the requested data. Finally, the server process then generates a reply including at least the requested data and transmits the reply to the client process. The data may be transferred, more commonly, as datagrams or a stream of characters (e.g., bytes, bits, symbols, etc.)

Shared memory refers to the allocation of virtual memory space in order to substantiate a mechanism for which data may be communicated and/or accessed by multiple processes. Other techniques may be used to share data, such as various data described in the present application, between processes without departing from the scope of the proposed solution. The processes may be part of the same or different application and may execute on the same or different computing system.

The above description of functions present only a few examples of functions performed by the computing system of FIG. 8. Other functions may be performed using one or more embodiments.

VCO Emulation with No Rx PLL

Figure 9:
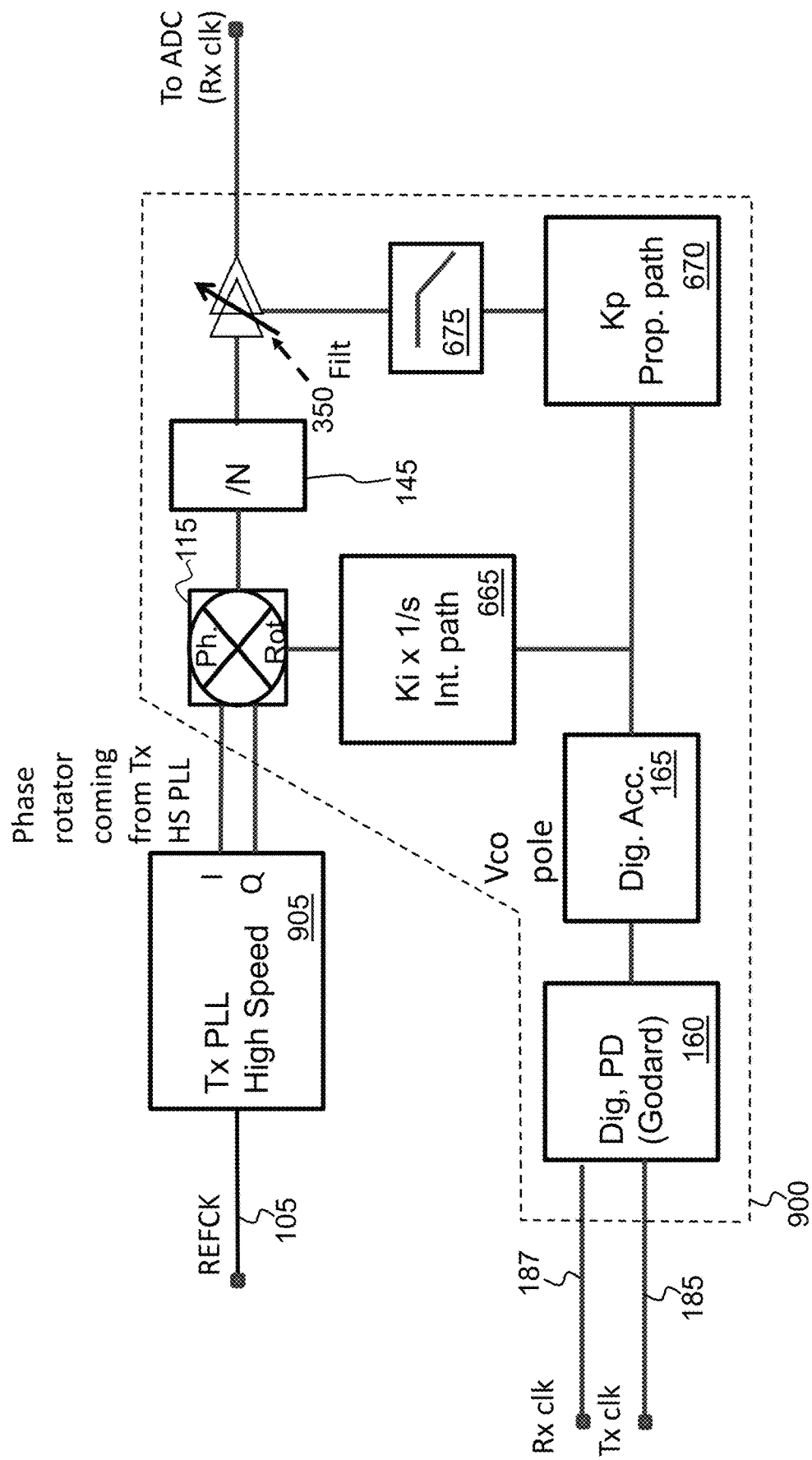
FIG. 9 is a schematic circuit diagram of a clock recovery circuit using segmented proportional/integral control and a digital VCO emulator with no Rx PLL in accordance with the proposed solution.

FIG. 9 is a schematic circuit diagram of a clock recovery circuit using segmented proportional/integral control and a digital VCO emulator with no Rx PLL in accordance with the proposed solution. Specifically, a clock recovery circuit 900 of FIG. 9 provides similar functionality as the clock circuit 695 in FIGS. 6 and 7 without the PLL device 100. Instead, the reference clock 105 is provided to a Tx PLL circuit 905 which connects to the phase rotator 115. The clock recovery circuit 900 includes the digital phase detector 160, the digital accumulator 165, the digital accumulator 665, and the feedback divider 145. Additionally, the clock recovery circuit 900 includes the digital filter (Kp) 670 driving fine resolution digitally controlled delay element 350 on the receiver clock signal 187.

The removal of the PLL device 100 provides lower power and smaller footprint, relative to the embodiments of FIGS. 6 and 7, but the frequency of the receiver clock signal 187 sent to the ADC is at most Fs/4.

While the proposed solution has been described with respect to a limited number of embodiments, those skilled in the art, having benefit of this disclosure, would appreciate that other embodiments can be devised which do not depart from the scope of the proposed solution as disclosed herein. Accordingly, the scope of the invention should be limited by the attached claims.

What is claimed is:

1. A clock circuit comprising:
a feedback path for providing a feedback signal from an output of a phase locked loop to an input of the phase locked loop; and
a phase rotator integrated in the feedback path, the phase rotator configured to apply a phase shift correction to the feedback signal, wherein the phase rotator is further configured to filter a portion of phase differences from the output of the phase locked loop.

2. The clock circuit of claim 1, wherein the phase rotator is configured to apply the phase shift correction to reduce a frequency offset and/or a phase misalignment between a transmitter clock signal and a receiver clock signal, the receiver clock signal corresponding to an output signal from the output of the phase locked loop.

3. The clock circuit of claim 1, wherein the phase rotator includes variable gain amplifiers configured to apply predetermined weights to an in-phase (I) component and a quadrature (Q) component of an input signal.

4. The clock circuit of claim 3, wherein the phase rotator is configured to generate a pair of differential phase signals corresponding to the I component and Q component, and wherein the phase rotator includes an interpolator circuit configured to generate a summation of the I component and Q component.

5. The clock circuit of claim 1, further comprising a delay element integrated in the feedback path, wherein the phase rotator and the delay element provide cascaded control of the feedback signal.

6. The clock circuit of claim 5, further comprising first and second digital phase detectors, the first digital phase detector configured to provide a first control signal to the phase rotator for integral phase control, the second digital phase detector configured to provide a second control signal to the delay element for proportional phase control.

7. The clock circuit of claim 5, further comprising a feedback divider integrated in the feedback path.

8. The clock circuit of claim 1, further comprising a digital phase detector and a digital accumulator, the digital phase detector configured to receive a transmitter clock signal and a receiver clock signal, the receiver clock signal corresponding to an output signal from the output of the phase locked loop, wherein the digital accumulator receives an output from the digital phase detector and provides a control signal to the phase rotator.

9. The clock circuit of claim 8, wherein the digital phase detector and digital accumulator are configured to combine multiple phased differences in an integration window.

10. The clock circuit of claim 8, further comprising a delay element, wherein the digital phase detector is configured to control the delay element.

11. The clock circuit of claim 8, wherein the phase rotator, digital phase detector, and digital accumulator are configured to suppress jitter.

12. The clock circuit of claim 1, further comprising a lookup table component, wherein the lookup table component is used to tune phase shift correction of the phase rotator.

13. A clock circuit comprising:
a feedback path for providing a feedback signal from an output of a phase locked loop to an input of the phase locked loop;
a phase rotator integrated in the feedback path, the phase rotator configured to apply a phase shift correction to the feedback signal;
a delay element integrated in the feedback path, wherein the phase rotator and the delay element provide cascaded control of the feedback signal; and
first and second digital phase detectors, the first digital phase detector configured to provide a first control signal to the phase rotator for integral phase control, the second digital phase detector configured to provide a second control signal to the delay element for proportional phase control.

14. The clock circuit of claim 13, wherein the phase rotator is configured to apply the phase shift correction to reduce a frequency offset and/or a phase misalignment between a transmitter clock signal and a receiver clock signal, the receiver clock signal corresponding to an output signal from the output of the phase locked loop.

15. The clock circuit of claim 13, further comprising a feedback divider integrated in the feedback path.

16. A clock circuit comprising:
a feedback path for providing a feedback signal from an output of a phase locked loop to an input of the phase locked loop; and
a phase rotator integrated in the feedback path, the phase rotator configured to apply a phase shift correction to the feedback signal; and
a digital phase detector and a digital accumulator, the digital phase detector configured to receive a transmitter clock signal and a receiver clock signal, the receiver clock signal corresponding to an output signal from the output of the phase locked loop, wherein the digital accumulator receives an output from the digital phase detector and provides a control signal to the phase rotator.

17. The clock circuit of claim 16, wherein the digital phase detector and digital accumulator are configured to combine multiple phased differences in an integration window.

18. The clock circuit of claim 16, further comprising a delay element, wherein the digital phase detector is configured to control the delay element.

19. The clock circuit of claim 16, wherein the phase rotator, digital phase detector, and digital accumulator are configured to suppress jitter.

* * * * *